(12) United States Patent
Numakura et al.

(10) Patent No.: US 12,444,632 B2
(45) Date of Patent: Oct. 14, 2025

(54) SYSTEM OF PROCESSING SUBSTRATE, TRANSFER METHOD, TRANSFER PROGRAM, AND HOLDER

(71) Applicant: TOKYO ELECTRON LIMITED, Tokyo (JP)

(72) Inventors: Masahiro Numakura, Miyagi (JP); Toshiaki Toyomaki, Miyagi (JP); Seiichi Kaise, Miyagi (JP); Yuki Takeyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 225 days.

(21) Appl. No.: 16/711,725

(22) Filed: Dec. 12, 2019

(65) Prior Publication Data

US 2020/0194296 A1 Jun. 18, 2020

(30) Foreign Application Priority Data

Dec. 12, 2018 (JP) .................................. 2018-232927
Mar. 14, 2019 (JP) .................................. 2019-047550

(51) Int. Cl.
*H01L 21/677* (2006.01)
*B65G 47/91* (2006.01)
(Continued)

(52) U.S. Cl.
CPC ........ *H01L 21/67745* (2013.01); *B65G 47/91* (2013.01); *H01L 21/67196* (2013.01); *H01L 21/67201* (2013.01); *H01L 21/67265* (2013.01); *H01L 21/67742* (2013.01); *H01L 21/68707* (2013.01)

(58) Field of Classification Search
None
See application file for complete search history.

(56) References Cited

U.S. PATENT DOCUMENTS 5,700,127 A * 12/1997 Harada ............. H01L 21/67161
414/416.08
11,990,323 B2 * 5/2024 Ishizawa ........... H01J 37/32642
(Continued)

FOREIGN PATENT DOCUMENTS

| CN | 102738048 A | 10/2012 |
| CN | 107622935 A | 1/2018 |

(Continued)

*Primary Examiner* — Karla A Moore
(74) *Attorney, Agent, or Firm* — XSENSUS LLP

(57) ABSTRACT

A system of processing a substrate includes an atmospheric-pressure transfer chamber, at least one vacuum processing chamber, at least two load-lock modules, a vacuum transfer chamber, a plurality of load ports, and a first transfer mechanism and a second transfer mechanism. The load ports are attached to the atmospheric-pressure transfer chamber and detachable containers are mounted on the load ports, respectively. A controller controls the first transfer mechanism and the second transfer mechanism to concurrently transfer a used consumable from the containers to the vacuum processing chamber through the atmospheric-pressure transfer chamber and one of the load-lock modules and to transfer a used consumable from the vacuum processing chamber through the vacuum transfer chamber and another one of the load-lock modules.

14 Claims, 22 Drawing Sheets

(51) Int. Cl.
  *H01L 21/67*  (2006.01)
  *H01L 21/687*  (2006.01)

(56)  References Cited

U.S. PATENT DOCUMENTS

| | | | | |
|---|---|---|---|---|
| 2001/0053324 | A1* | 12/2001 | Saeki | H01L 21/67775 29/25.01 |
| 2002/0020355 | A1* | 2/2002 | Saeki | H01L 21/67766 118/719 |
| 2003/0168173 | A1* | 9/2003 | Tamura | C23C 14/566 156/345.31 |
| 2006/0090703 | A1* | 5/2006 | Kaise | H01L 21/6831 118/719 |
| 2009/0078196 | A1* | 3/2009 | Midorikawa | H01L 21/30655 118/708 |
| 2011/0031111 | A1* | 2/2011 | Kobayashi | H01J 37/32642 204/192.34 |
| 2012/0325140 | A1* | 12/2012 | Schaller | C23C 14/568 118/50 |
| 2015/0340209 | A1* | 11/2015 | Koltonski | H01J 37/32642 156/345.31 |
| 2017/0053819 | A1* | 2/2017 | Richardson | H01J 37/3244 |
| 2017/0117170 | A1* | 4/2017 | Wong | H01L 21/67201 |
| 2017/0117172 | A1* | 4/2017 | Genetti | H01L 21/68785 |
| 2018/0061692 | A1 | 3/2018 | Nishino et al. | |

FOREIGN PATENT DOCUMENTS

| | | | |
|---|---|---|---|
| JP | H07-086369 A | 3/1995 | |
| JP | H10-189683 A | 7/1998 | |
| JP | 2001023872 A | 1/2001 | |
| JP | 2005-259930 A | 9/2005 | |
| JP | 2006-041126 A | 2/2006 | |
| JP | 2012-216614 A | 11/2012 | |
| JP | 2014038888 A | 2/2014 | |
| JP | 2017050535 A * | 3/2017 | ............ G01B 21/02 |
| JP | 2017-098540 A | 6/2017 | |
| JP | 2018-10992 A | 1/2018 | |
| JP | 2018-037559 A | 3/2018 | |
| KR | 20040019822 A | 3/2004 | |
| KR | 200411345 Y1 | 3/2006 | |
| KR | 20070042609 A | 4/2007 | |
| KR | 20150097736 A | 8/2015 | |
| KR | 20170026824 A | 3/2017 | |
| KR | 20170054248 A | 5/2017 | |
| KR | 20170113244 A | 10/2017 | |
| TW | 202508947 A * | 3/2025 | |

* cited by examiner

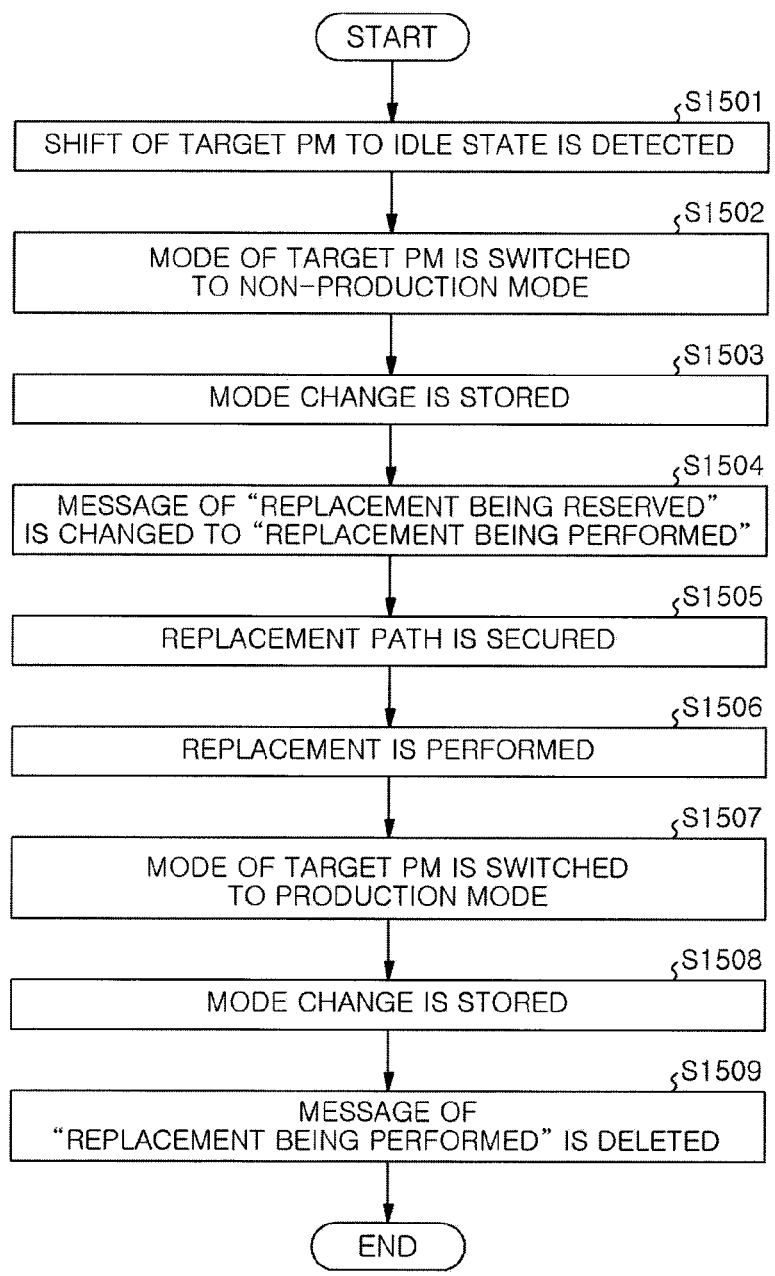

FIG. 12

| LLM CONSECUTIVE OPERATION | 20 sec | | | |
|---|---|---|---|---|
| UNUSED FR | LP→LA GET | 25 sec | USED FR | PM→TA GET | 25 sec |
| | LA→LLM PUT | 25 sec | | TA→LLM PUT | 25 sec |
| | LLM VACUUM EVACUATION | 10 sec | | LLM EXPOSED TO ATMOSPHERE | 10 sec |
| | LLM→TA GET | 25 sec | | LLM→LA GET | 25 sec |
| | TA→PM PUT | 25 sec | | LA→LP PUT | 25 sec |
| | PIN DOWN/GATE CLOSE | 10 sec | | | |
| TOTAL IN TRANSFER OPERATION | 140 sec | | TOTAL IN RETRIEVAL OPERATION | 130 sec |

…

SYSTEM OF PROCESSING SUBSTRATE, TRANSFER METHOD, TRANSFER PROGRAM, AND HOLDER

CROSS-REFERENCE TO RELATED APPLICATIONS

This application claims priority to Japanese Patent Application Nos. 2018-232927 and 2019-047550, filed on Dec. 12, 2018 and Mar. 14, 2019, the entire contents of which are incorporated herein by reference.

TECHNICAL FIELD

The present disclosure relates to a system of processing a substrate, a transfer method, a transfer program, and a holder.

BACKGROUND

A plasma processing apparatus has been known that performs plasma processing on a substrate mounted on a table disposed in a processing chamber. Such a plasma processing apparatus includes consumables that are gradually degraded by repeated plasma processing.

A typical example of the consumables is a focus ring disposed to surround the outer periphery of the substrate mounted on the table. The focus ring is eroded by exposure to plasma, and thus should be regularly replaced.

For example, Japanese Patent Application Publication No. 2018-10992 discloses a method for replacing a focus ring by loading and unloading the focus ring without exposing a processing chamber to the atmosphere. Japanese Patent Application Publication No. 2012-216614 discloses a technique for shortening the outage time of the vacuum processing for inspection of the state of a surface member of a substrate table or for replacing the surface member of the substrate table. Japanese Patent Application Publication No. 2017-98540 discloses a pod for replacing consumables.

The present disclosure provides a technique capable of achieving a high operation rate of a system of processing a substrate by shortening the outage time required to replace a used consumable with an unused one in a vacuum processing chamber.

SUMMARY

In accordance with an aspect of the present disclosure, there is provided a system of processing a substrate, including: an atmospheric-pressure transfer chamber; at least one vacuum processing chamber for processing the substrate; a vacuum transfer chamber adjacent to the vacuum processing chamber, the substrates and the consumables being configured to be transferred in the vacuum transfer chamber under a reduced pressure; a plurality of load ports attached to the atmospheric-pressure transfer chamber; at least two load-lock modules disposed between the atmospheric-pressure transfer chamber and the vacuum transfer chamber, the load-lock modules each being configured to transfer the substrate or a consumable between the atmospheric-pressure transfer chamber and the vacuum transfer chamber; a plurality of containers to be mounted on the respective load ports, the substrate or the consumable being configured to be transferred between the atmospheric-pressure transfer chamber and each of the containers; a first transfer mechanism configured to transfer the substrate and the consumable between the load-lock modules and the vacuum processing chamber through the vacuum transfer chamber; a second transfer mechanism configured to transfer the substrates and the consumables between the containers and the load-lock modules through the atmospheric-pressure transfer chamber; and a controller configured to control the first transfer mechanism and the second transfer mechanism to concurrently transfer an unused consumable from one of the containers to the vacuum processing chamber through the atmospheric-pressure transfer chamber and one of the load-lock modules and to transfer a used consumable from the vacuum processing chamber through the vacuum transfer chamber to another one of the load-lock modules.

BRIEF DESCRIPTION OF THE DRAWINGS

The objects and features of the present disclosure will become apparent from the following description on embodiments, given in conjunction with the accompanying drawings, in which:

FIG. 9 is a flowchart showing an example replacement process in the system according to the embodiment;

FIG. 12 explains a reduction in outage time for replacing a focus ring in the system according to the embodiment;

DETAILED DESCRIPTION

Embodiments will now be described in detail with reference to the accompanying drawings. The embodiments are not intended to limit the present disclosure. The embodiments can be appropriately combined without contradicting processing contents.

Example Configuration of System of Processing a Substrate According to Embodiment In a system of processing a substrate (hereinafter simply referred to as system) according to an embodiment, a used consumable is transferred from a vacuum processing chamber to a container, and an unused consumable is transferred from the container to the vacuum processing chamber. In one embodiment, the used consumable and the unused consumable are transferred concurrently (in parallel).

The consumable is a component that is deteriorated by repeated plasma treatment in a system of processing a substrate including a plurality of vacuum processing chambers under a reduced atmosphere. The deteriorated consumable should be replaced with an unused consumable. The consumable is, for example, a focus ring disposed on a table in the chamber. The consumable includes any other component that can be loaded into or unloaded from the chamber with a transfer device, such as a robot arm. In the following description, the focus ring will be described an example of the consumable. In the following description, "vacuum" refers to a state of a space filled with a gas having a pressure lower than an atmospheric pressure. In other words, in the following description, "vacuum" includes a depressurized state or a negative-pressure state. In the following description, "atmospheric-pressure" refers to a pressure that is substantially equal to the atmospheric pressure.

Figure 1:
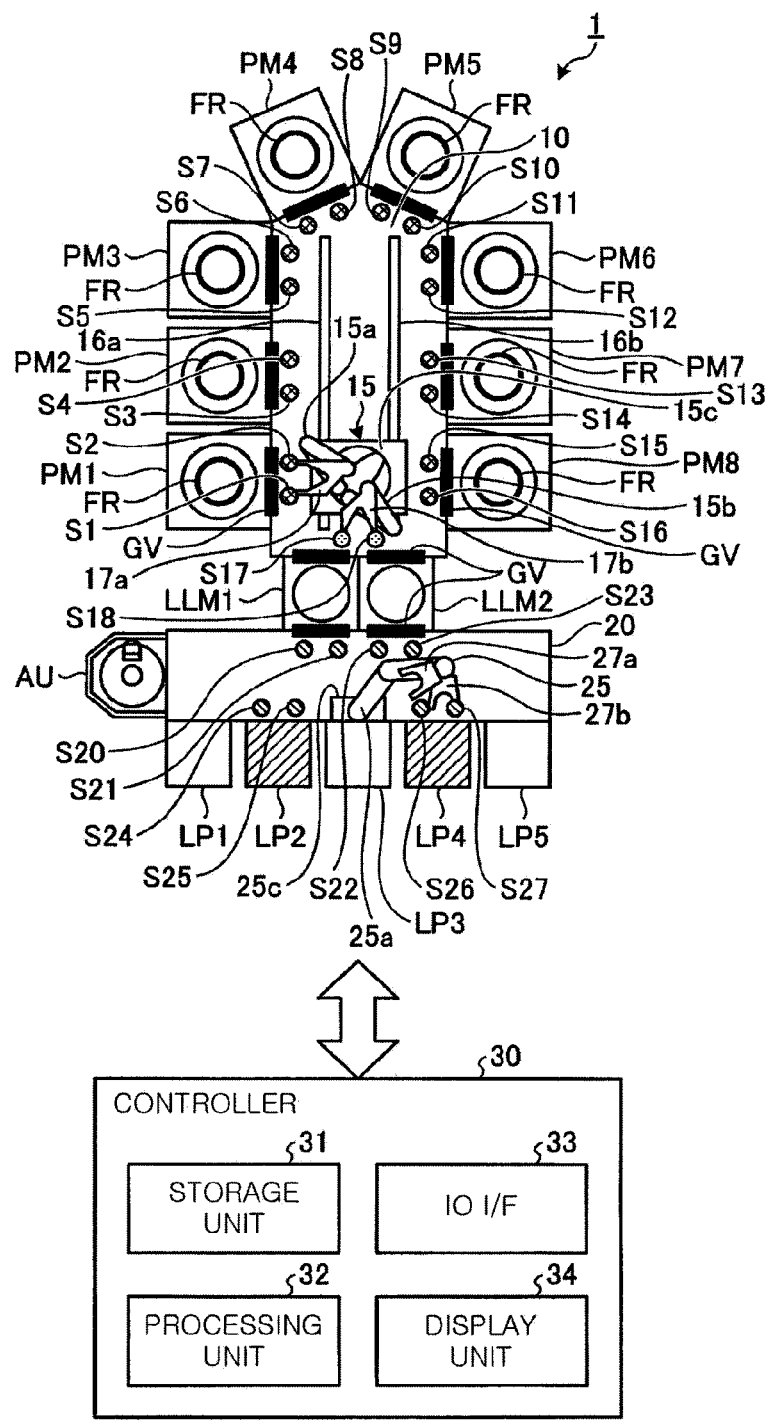
FIG. 1 schematically shows a system of processing a substrate according to an embodiment.

FIG. 1 schematically shows a system 1 of processing a substrate according to an embodiment.

The system 1 includes a plurality of processing modules PMs (PM1 to PM8), a vacuum transfer chamber 10, at least two load-lock modules LLMs (LLM1 and LLM2), an atmospheric-pressure transfer chamber 20, and a plurality of load ports LPs (LP1 to LP5), and a controller 30.

FIG. 1 illustrates eight processing modules PM1 to PM8, two load-lock modules LLM1 to LLM2, and five load ports LP1 to LP5. However, the number of the processing modules PMs, the number of the load-lock modules LLMs, and the number of the load ports LPs of the system 1 should not be limited to the illustrated numbers. Hereinafter, the eight processing modules PM1 to PM8 will be collectively referred to as "processing module PM" unless otherwise stated. Similarly, the two load-lock modules LLM1 and LLM2 will be collectively referred to as "load-lock module LLM." Similarly, the five load ports LP1 to LP5 will be collectively referred to as "load port LP." The system 1 of the present embodiment includes at least two load-lock modules LLM.

In the processing module PM, a semiconductor substrate (hereinafter, referred to as "wafer W") is processed under a reduced atmosphere. The processing module PM is an example of the vacuum processing chamber. The processing module PM performs a variety of treatments, for example, etching and formation of films. The processing module PM includes a table for supporting the wafer W and a focus ring FR disposed on the table to surround the wafer W. The processing module PM further includes first lifter pins (see, reference numerals 172 in FIGS. 2 and 3, for example) that are disposed in a region where the wafer W is to be mounted and capable of moving up and down and second lifter pins (see, reference numerals 182 in FIGS. 2 and 3) that are disposed in a region where the focus ring FR is to be mounted and capable of moving up and down. When the first lifter pins are lifted, the wafer W is raised from the table. When the second lifter pins are lifted, the focus ring FT is raised from the table. The inside of the processing module PM is maintained in a reduced atmosphere during the processing of the wafer W.

Each processing module PM is connected to the vacuum transfer chamber 10 through a gate valve GV. The gate valve GV is closed during the treatment of the wafer W in the processing module PM. The gate valve GV is opened when a processed wafer W is unloaded from the processing module PM or when an unprocessed wafer W is loaded into the processing module PM. The gate valve GV is also opened when the focus ring FR is loaded into or unloaded from the processing module PM. The processing module PM includes a gas supply for supplying a predetermined gas and a ventilator for evacuating the used gas. The processing modules PM will be described in detail later.

The inside of the vacuum transfer chamber 10 can be maintained in a reduced atmosphere. The wafer W is transferred to each processing module through the vacuum transfer chamber 10. In the example of FIG. 1, the vacuum transfer chamber 10 has a substantially pentagonal shape in top view, and the processing modules PM are disposed along four sides of the vacuum transfer chamber 10 to surround the vacuum transfer chamber 10. A wafer W processed in one processing module PM can be transferred to a subsequent processing module PM for performing subsequent processing through the vacuum transfer chamber 10. The wafer W that has been subjected to all processes is transferred to the load-lock module LLM through the vacuum transfer chamber 10. The vacuum transfer chamber 10 includes a gas supply (not shown) for supplying a predetermined gas and a ventilator for evacuating the gas (not shown).

A first transfer mechanism for transferring the wafer W and the focus ring FR (hereinafter, also referred to as "transfer object") is disposed in the vacuum transfer chamber 10. The first transfer mechanism is, for example, a vacuum transfer module (VTM) arm 15 shown in FIG. 1.

The VTM arm 15 transfers the transfer object between the processing modules PM1 to PM8 and the load-lock modules LLM1 and LLM2.

The VTM arm 15 shown in FIG. 1 has a first arm 15a and a second arm 15b. The first arm 15a and the second arm 15b are installed on a base 15c. The base 15c is configured to slide on guide rails 16a and 16b in a longitudinal direction of the vacuum transfer chamber 10. For example, the base 15c is moved in the vacuum transfer chamber 10 by screw drive motors coupled to the guide rails 16a and 16b. The first arm 15a and the second arm 15b are rotatably fixed on the base 15c. A substantially U-shaped first pick 17a and a substantially U-shaped second pick 17b are rotatably connected to respective tip ends of the first arm 15a and the second arm 15b.

The VTM arm 15 includes a motor (not shown) for extending and contracting the first arm 15a and the second arm 15b, and a motor (not shown) for raising and lowering the first arm 15a and the second arm 15b.

The vacuum transfer chamber 10 includes first sensors S1 to S16 disposed before the processing modules PMs. Each pair of first sensors corresponds to one processing module PM. The first sensors S1 to S16 detect misalignment of the focus ring FR and a misalignment, respectively, of the wafer W being transferred to the corresponding processing module PM. The transfer position is corrected based on the detected position. Positional information on the wafer W and positional information on the focus ring FR detected by the first sensors S1 to S16 are transmitted to the controller 30. The first sensors S1 and S2 disposed in front of the processing module PM1 will be described on behalf of the first sensors S1 to S16, having the same configuration.

Each of the first sensors S1 and S2 is, for example, a photoelectric sensor, and has an upper light transmitter and a lower light receiver. Each of the first sensors S1 and S2 is disposed on a transfer path of the wafer W and the focus ring FR from the vacuum transfer chamber 10 to the processing module PM1. For example, the first sensors S1 and S2 are disposed such that at least parts of the wafer W and the focus ring FR can pass through spaces between the light transmitting units and the light receiving units of the first sensors S1 and S2. When the VTM arm 15 holds and transfers the wafer W to the processing module PM1, the wafer W passes the space at a position below the light transmitting units of the sensors S1 and S2. The light transmitting units positioned above the wafer W emit light, and the light receiving units positioned below the wafer W receive the emitted light. While the wafer W is passing the space at the position below the light transmitting units, the light reception of the light receiving units is stopped. After the wafer W passes the space at the position below the light transmitting units, the light reception of the light receiving units is resumed. Therefore, the misalignment of the wafer W or the misalignment of the focus ring FR can be detected based on a time period in which the light reception is stopped in the first sensors S1 and S2. The controller 30 corrects the position of the wafer W, i.e., the position of the VTM arm 15, based on the position information transmitted from the first sensors S1 and S2, and then transfers the wafer W or the focus ring FR to the processing module PM1.

The vacuum transfer chamber 10 further includes second sensors S17 and S18 disposed in a corresponding relationship with the load-lock modules LLM. The second sensors S17 and S18 are disposed on transfer paths between the load-lock modules LLM1 and LLM2 and the vacuum transfer chamber 10, respectively. In the example of FIG. 1, one second sensor is disposed in front of one load-lock module LLM. The VTM arm 15 transfers the transfer object to a front side of the load-lock module LLM and waits in front of the load-lock module LLM until the second sensor S17 or S18 detects the transfer object. When the transfer object cannot be detected by the second sensor S17 (S18), the VTM arm 15 rotates a tip end of the first pick 17a (17b) during a transfer operation in a clockwise direction or counterclockwise direction on the horizontal plane in response to an instruction from the controller 30 so that the transfer object can be moved to a position where it can be detected by the second sensor S17 (S18). When the second sensor S17 (S18) detects the transfer object, the VTM arm 15 resumes the transfer of the transfer object to the load-lock module LLM that is a predetermined transfer destination.

Each load-lock module LLM includes a table on which a transfer object is mounted, and support pins for raising and lowering the wafer W and the focus ring FR. The support pins may have the same configuration as those of the first lifter pins and the second lifter pins in the processing module PM which will be described later. Each load-lock module LLM includes a gas exhaust mechanism (not shown), for example, a vacuum pump and a leakage valve, and an atmosphere in the load-lock module LLM can be switched between an atmospheric atmosphere and a reduced atmosphere. The load-lock modules LLM are disposed side by side along one side of the vacuum transfer chamber 10 where the processing modules PM are not disposed. The load-lock modules LLM and the vacuum transfer chamber 10 can communicate with each other through gate valves GV.

The VTM arm 15 holds the transfer object lifted by the support pins from the table in the load-lock module LLM and transfers the transfer object to the table in the processing module PM. The VTM arm 15 also holds the wafer W lifted by raising the first lifter pins (see reference numerals 172 in FIG. 2) in the processing module PM, and transfers the wafer W to the table in the load-lock module LLM. Moreover, the VTM arm 15 holds the focus ring FR lifted by raising the second lifter pins (see reference numerals 182 in FIG. 2) in the processing module PM, and transfers the focus ring FR to the table in the load-lock module LLM.

The load-lock modules LLM are connected to the atmospheric-pressure transfer chamber 20 on the side remote from the vacuum transfer chamber 10. The load-lock modules LLM and the atmospheric-pressure transfer chamber 20 can communicate with each other through gate valves GV.

The atmospheric-pressure transfer chamber 20 is maintained in an atmospheric-pressure atmosphere. In the embodiment of FIG. 1, the atmospheric-pressure transfer chamber 20 has a substantially rectangular shape in top view. The load-lock modules LLMs are disposed along one longitudinal side of the atmospheric-pressure transfer chamber 20. The load ports LPs are disposed along on the other longitudinal side of the atmospheric-pressure transfer chamber 20. A second transfer mechanism for transferring the transfer object between the load-lock modules LLMs and the load ports LPs is disposed in the atmospheric-pressure transfer chamber 20. The second transfer mechanism is, for example, a loader module (LM) arm 25 shown in FIG. 1. The LM arm 25 has an arm 25a. The arm 25a is rotatably fixed on a base 25c. The base 25c is fixed near the load port LP3. A substantially U-shaped first pick 27a and a substantially U-shaped second pick 27b are rotatably connected to a tip end of the arm 25a.

At least one of the first pick 27a and the second pick 27b has mapping sensors MS (not shown) at the tip end thereof. For example, the mapping sensors MS are disposed at two end portions of the U-shaped tip end of each of the first pick 27*a* and the second pick 27*b*. When a front opening unified pod (FOUP) to be described later is connected to the load port LP, a lid of the FOUP is opened and a mapping of the mapping sensors MS is performed. In other words, the mapping sensors MS detect the wafer W or the focus ring FR in the FOUP and transmits the detection result to the controller 30. Since the wafer W and the focus ring FR have different thicknesses or different arrangement intervals in the FOUP, the controller 30 switches a threshold of the mapping sensors MS depending on types of FOUPs (detection targets) to be described later.

Third sensors S20 to S27 are disposed in the atmospheric-pressure transfer chamber 20. The third sensors S20 to S27 detect the wafer W and the focus ring FR that are being transferred. The third sensors S20 to S23 detect a transfer object between the load-lock modules LLM and the atmospheric-pressure transfer chamber 20. The third sensors S24 to S27 detect a transfer object between the atmospheric-pressure transfer chamber 20 and the load ports LP. The third sensors S20 to S27 are disposed on transfer paths of the LM arm 25 between doors (to be described later) of the load ports LP and the load-lock modules LLM. The third sensors S20 to S27 are disposed in pairs in front of the load-lock modules LLM1 and LLM2 and the load ports LP2 and LP4. The third sensors S20 to S27 may be transmissive photoelectric sensors, similar to the first sensors S1 to S16. The third sensors S20 to S27 are configured to detect both of the wafer W and the focus ring FR.

During the transfer of the wafer W or the focus ring FR, detection errors of the first sensors S1 to 16, the second sensors S17 and 18, and the third sensors S20 to S27 may occur. In this case, failure such as the falling of the transfer object from the VTM arm 15 or the LM arm 25, or the like may have occurred. Therefore, when the detection error occurs, the system 1 stops the processing. However, when the detection error occurs, it is also possible to horizontally move the tip end of the pick of the VTM arm 15 or the LM arm 25 that is a detection error target and perform re-detection, instead of immediately stopping the processing of the system 1. If the detection error occurs again as a result of the re-detection, the system 1 stops the processing. When the transfer object is detected as a result of the re-detection, the system 1 resumes the processing.

In the example of FIG. 1, among the load ports LP1 to LP5, only the load ports LP2 and LP4 are provided with the third sensors corresponding thereto. In the example of FIG. 1, the third sensors are disposed to correspond to the load ports LP on which the FOUPs for the focus ring FR can be installed. In another example, the third sensors may be disposed to correspond to all the load ports LP.

The FOUP accommodating the wafer W or the focus ring FR can be mounted on each load port LP. The FOUP is a container that accommodates the wafer W or the focus ring FR. The FOUP has a lid that can be opened and closed. When the FOUP is mounted on the load port LP, the lid of the FOUP and the door of the load port LP are engaged. Then, a latch of the lid of the FOUP is released so that the lid of the FOUP can be opened. In this state, if the door of the load port LP is opened, the lid of the FOUP is moved together with the door. Accordingly, the FOUP is opened, and the inside of the FOUP communicates with the inside of the atmospheric-pressure transfer chamber 20 through the load port LP. The FOUP according to an embodiment includes a wafer FOUP capable of accommodating the wafer W and a focus ring (FR) FOUP capable of accommodating the focus ring FR. The wafer FOUP is an example of a first container, and the FR FOUP is an example of a second container.

The wafer FOUP has shelf-shaped containers, the number of the shelf-shaped containers corresponding to the number of wafers W to be accommodated. The FR FOUP is configured to accommodate the focus rings FR, the number of the focus rings FR corresponding to the number of processing modules PM of the system 1, for example. Specifically, when there are eight processing module PM where the focus rings FR are disposed, the FR FOUP can accommodate eight unused focus rings FR and eight used focus rings FR. The unused focus rings FR can be accommodated in an upper accommodating portion of the FR FOUP, and the used eight focus rings FR can be accommodated in a lower accommodating portion of the FR FOUP. The used focus rings FR are accommodated in the lower accommodating portion to prevent particles adhered to the used focus rings FR from being adhered to the unused focus rings FR. The number of the wafers W and the number of the focus rings FR that can be accommodated in the wafer FOUP and the FR FOUP are merely an example, and the wafer FOUP and the FR FOUP can be configured to accommodate any number of the wafers W and any number of the focus rings FR, respectively.

The load ports LP include a first load port on which the wafer FOUP can be mounted and a second load port on which the FR FOUP can be mounted. In the example of FIG. 1, the load ports LP1, LP3, and LP5 are the first load ports. The load ports LP2 and LP4 are the second load ports. The first load port is an example of a first load port, and the second load port is an example of a second load port. In one embodiment, the second load port can mount thereon both of the wafer FOUP and the FR FOUP. The FR FOUP may be mounted only when the focus ring FR is replaced, or may be mounted constantly. In another example, one second load port may be provided.

Each of the load ports LP includes a reading unit (not shown) for reading a carrier ID (Identifier) of the FOUP. The carrier ID is an identifier for identifying types of FOUPs or the like. A naming rule for the carrier ID can be preset in the system 1 to distinguish the FR FOUP and the wafer FOUP. For example, a carrier ID that starts with a predetermined character string may be set to be recognized as a carrier ID of the FR FOUP, and a carrier ID that starts with another predetermined character string may be set to be recognized as a carrier ID of the wafer FOUP. For example, in the system 1, a carrier ID that starts with "FR_" is set as the carrier ID of the FR FOUP, and a carrier ID that starts with "W_" is set as the carrier ID of the wafer FOUP. The naming rule for the carrier ID may be set by default or by an operator. When the FOUP is mounted on and engaged with the load port LP, the reading unit reads the carrier ID assigned to the FOUP. The system 1 identifies whether the FOUP is a wafer FOUP or an FR FOUP based on the carrier ID. When the carrier ID is authenticated and the FOUP is connected to the load port LP, the lid of the FOUP is opened together with the door of the load port, and the wafer W or the focus ring FR accommodated in the FOUP is detected by the mapping sensor MS of the LM arm 25.

An aligner AU is disposed on one short side of the atmospheric-pressure transfer chamber 20. The aligner AU includes a rotation table for mounting thereon the wafer W and an optical sensor for optically detecting an outer peripheral edge of the wafer W. The aligner AU aligns the wafer W by detecting, for example, an orientation flat or a notch of the wafer W.

The processing modules PMs, the vacuum transfer chamber 10, the VTM arm 15, the load-lock modules LLMs, the atmospheric-pressure transfer chamber 20, the LM arm 25, the load ports LPs, and the aligner AU are connected to and controlled by the controller 30.

The controller 30 is an information processing device for controlling the components of the system 1. The controller 30 may have any configuration and function. The controller 30 includes, for example, a storage unit 31, a processing unit 32, an input/output interface (IO I/F) 33, and a display unit 34. The storage unit 31 may be any storage device, for example, a hard disk, an optical disk, a semiconductor memory device, or the like. The processing unit 32 is a processor, for example, a central processing unit (CPU), or a micro processing unit (MPU). The display unit 34 is a functional unit, such as a liquid crystal screen or a touch panel, which displays information.

The processing unit 32 reads and executes a program or a recipe stored in the storage unit 31 to control the individual components of the system 1 through the input/output interface 33. The processing unit 32 also identifies the type of a FOUP connected to the load port LP based on the carrier ID read by the reading unit in the load port LP, and stores the identified FOUP type in the storage unit 31. Moreover, the processing unit 32 receives information on the wafer W and the focus ring FR in the FOUP detected by the mapping sensor MS and stores the received information in the storage unit 31. The processing unit 32 receives contents and statuses of processing that is being performed in each processing module PM from a sensor (not shown) in the processing module PM, and stores the received information in the storage unit 31. In addition, the controller 30 receives notification of the errors detected by the second sensors and the third sensors and performs re-detection or stops the processing. The controller 30 controls and performs a replacement timing notification process, an FR FOUP installation process, an FR FOUP removal process, a replacement request process, a replacement request cancel process, and a replacement process which will be described later.

(Example Configuration of Processing Module PM)

Figure 2:
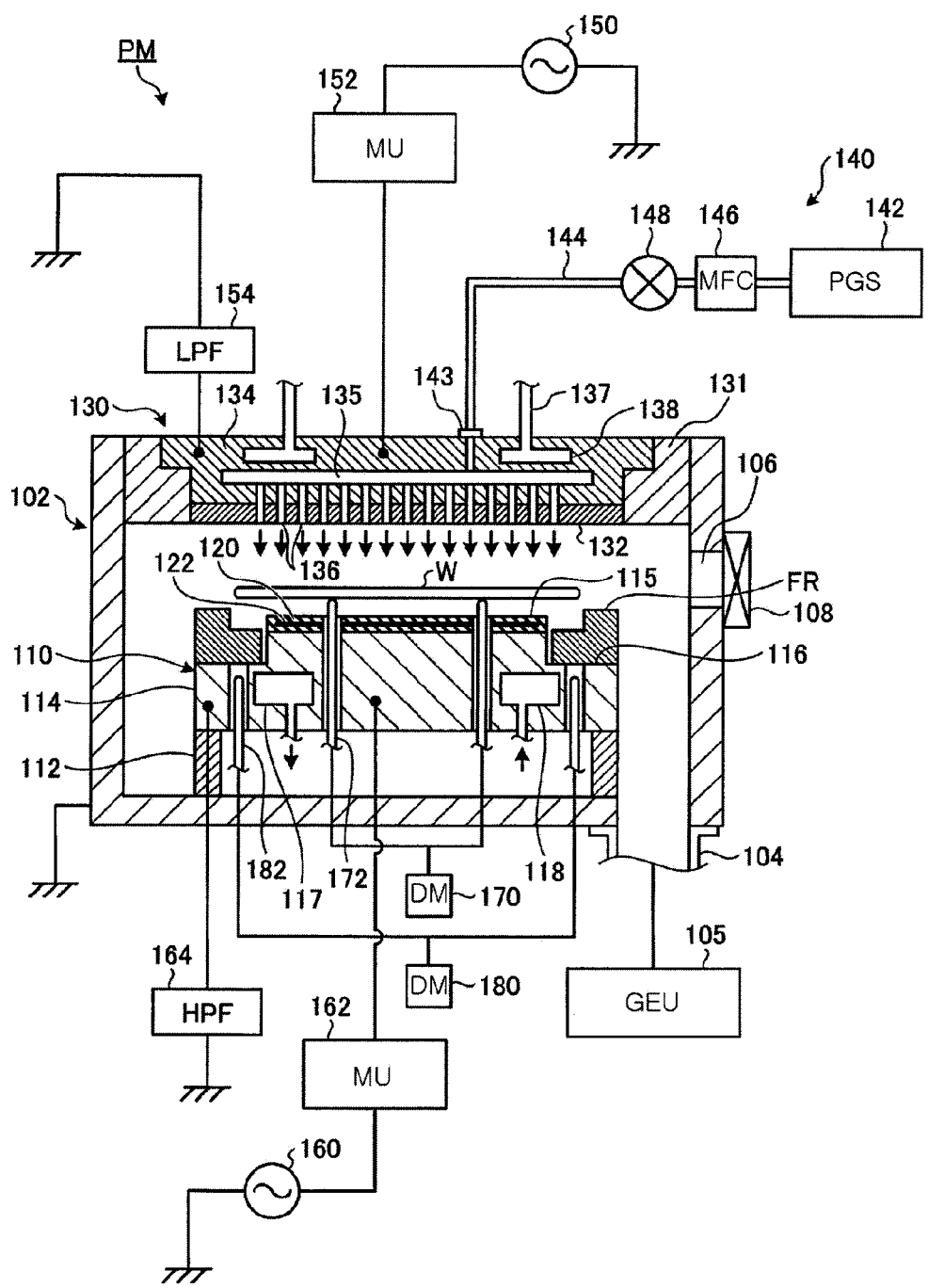
FIG. 2 schematically shows an example processing module of the system according to the embodiment.

FIG. 2 schematically shows an example of the processing module PM of the system 1 according to the embodiment. The processing module PM shown in FIG. 2 is a parallel plate type plasma processing apparatus.

The processing module PM includes a processing chamber 102 having a cylindrical processing container made of, for example, aluminum having an anodically oxidized (alumite-treated) surface. The processing chamber 102 is frame-grounded. A substantially cylindrical table 110 for mounting thereon the wafer W is provided at a bottom portion of the processing chamber 102. The table 110 includes a plate-shaped insulator 112 made of ceramic or the like, and a susceptor 14 disposed on the insulator 112 and serving as a lower electrode.

The table 110 includes a susceptor-temperature control unit 117 capable of controlling a temperature of the susceptor 114 to a predetermined temperature. The susceptor-temperature control unit 117 is configured to circulate a temperature control medium through, for example, a temperature control medium space 118 formed in the susceptor 114.

The susceptor 114 has a substrate mounting portion at an upper center portion thereof. A top face of the substrate mounting portion serves as a substrate mounting surface 115. A top face of a peripheral portion of the susceptor 114 which is lower than the upper central portion of the susceptor 114 serves as a focus ring mounting surface 116 for mounting thereon the focus ring FR. As shown in FIG. 2, when the electrostatic chuck 120 is disposed on the substrate mounting portion, the top face of the electrostatic chuck 120 serves as the substrate mounting surface 115. The electrostatic chuck 120 has a structure in which an electrode 122 is embedded between insulating materials. A DC voltage of, for example, 1.5 kV, is applied from a DC power supply (not shown) connected to the electrode 122 to the electrostatic chuck 120. Accordingly, the wafer W is electrostatically attracted to and held on the electrostatic chuck 120. The substrate mounting portion has a diameter smaller than that of the wafer W. When the wafer W is mounted on the substrate mounting portion, the peripheral portion of the wafer W projects from the substrate mounting portion.

The focus ring FR is disposed on the peripheral portion of the susceptor 114 to surround the wafer W mounted on the substrate mounting surface 115 of the electrostatic chuck 120. The focus ring FR is mounted on the focus ring mounting surface 116 of the susceptor 114.

A gas passage for supplying a heat transfer medium (for example, a backside gas such as He gas or the like) to a backside of the wafer W mounted on the substrate mounting surface 115 is formed in the insulator 112, the susceptor 114, and the electrostatic chuck 120. Heat is transferred between the susceptor 114 and the wafer W by the heat transfer medium, thereby maintaining the wafer W at a predetermined temperature.

An upper electrode 130 is disposed above the susceptor 114 to be opposite to the susceptor 114. A space formed between the upper electrode 130 and the susceptor 114 becomes a plasma generation space. The upper electrode 130 is supported at the upper portion of the processing chamber 102 through an insulating shielding member 131.

The upper electrode 130 mainly includes an electrode plate 132 and an electrode holder 134 for detachably holding the electrode plate 132. The electrode plate 132 is made of, for example, quartz, and the electrode holder 134 is made of a conductive material, for example, aluminum having an alumite-treated surface or the like.

A processing gas supply unit 140 for introducing a processing gas from a processing gas supply source (PGS) 142 into the processing chamber 102 is provided at the electrode holder 134. The processing gas supply source 142 is connected to a gas inlet port 143 of the electrode holder 134 through a gas supply line 144.

In the gas supply line 144, as shown in FIG. 2, a mass flow controller (MFC) 146 and an opening/closing valve 148 are disposed in that order from an upstream side thereof. A flow control system (FCS) may be provided instead of the MFC. An etching gas, for example, a fluorocarbon gas ($C_xF_y$) such as $C_4F_8$ gas is supplied from the processing gas supply source 142.

The processing gas supply source 142 is configured to supply, for example, an etching gas for plasma etching. FIG. 2 shows one processing gas supply system including the gas supply line 144, the opening/closing valve 148, the mass flow controller 146, the processing gas supply source (PGS) 142, and the like. However, the processing module PM includes a plurality of processing gas supply systems. For example, processing gases such as $CF_4$, $O_2$, $N_2$, $CHF_3$ and the like are supplied into the processing chamber 102 at individually controlled flow rates.

The electrode holder 134 is provided with, for example, a substantially cylindrical gas diffusion space 135, so that the processing gas introduced from the gas supply line 144 can be uniformly diffused. A plurality of gas injection holes 136 for injecting the processing gas from the gas diffusion space 135 into the processing chamber 102 is formed in the bottom portion of the electrode holder 134 and the electrode plate 132. The processing gas diffused in the gas diffusion space 135 can be injected uniformly from the gas injection holes 136 toward the plasma generation space. Therefore, the upper electrode 130 can serve as a shower head for supplying the processing gas.

The upper electrode 130 includes an electrode holder temperature control unit 137 capable of controlling the electrode holder 134 to a predetermined temperature. The electrode holder temperature control unit 137 is configured to circulate a temperature control medium through, for example, a temperature control medium space 138 formed in the electrode holder 134.

A gas exhaust line 104 is connected to the bottom portion of the processing chamber 102, and a gas exhaust unit (GEU) 105 is connected to the gas exhaust line 104. The exhaust unit 105 includes a vacuum pump such as a turbo molecular pump or the like, and controls an atmosphere in the processing chamber 102 to a predetermined reduced atmosphere. A loading/unloading port 106 for the wafer W is disposed on a sidewall of the processing chamber 102, and a gate valve 108 (corresponding to GV in FIG. 1) is disposed at the loading/unloading port 106. When the wafer W is loaded and unloaded, the gate valve 108 is opened. The wafer W is loaded and unloaded through the loading/unloading port 106 by a transfer arm (not shown) or the like.

A first high frequency power supply 150 is connected to the upper electrode 130, and a first matching unit (MU) 152 is disposed in a power supply line therebetween. The first high frequency power supply 150 outputs a high frequency power for plasma generation having a frequency ranging from 50 MHz to 150 MHz. By applying such a high frequency power to the upper electrode 130, high-density plasma in a desirable dissociation state can be generated in the processing chamber 102 and the plasma processing can be performed under a lower pressure condition. The frequency of the power output from the first high frequency power supply 150 preferably ranges from 50 MHz to 80 MHz, and is typically controlled to 60 MHz or a frequency close to 60 MHz.

A second high frequency power supply 160 is connected to the susceptor 114 serving as the lower electrode, and a second matching unit (MU) 162 is disposed in a power supply line therebetween. The second high frequency power supply 160 outputs a high frequency power for bias having a frequency ranging from several hundreds of kHz to several tens of MHz. The frequency of the power outputted from the second high frequency power supply 160 is typically controlled to 2 MHz or 13.56 MHz.

The susceptor 114 is connected to a high pass filter (HPF) 164 for filtering a high frequency current flowing from the first high frequency power supply 150 to the susceptor 114. The upper electrode 130 is connected to a low pass filter (LPF) 154 for filtering a high frequency current flowing from the second high frequency power supply 160 to the upper electrode 130.

The processing module PM is connected to the controller 30 of the system 1. The controller 30 controls the respective components of the processing module PM. The input/output interface 33 of the controller 30 includes a keyboard through which an operator inputs instructions to manage the processing module PM, a display for visualizing and displaying an operation status of the processing module PM, or the like.

The storage unit 31 stores programs for achieving various processes performed in the processing module PM under the control of the controller 30, processing conditions (recipe) required to execute the program, or the like. The processing conditions include a plurality of parameter values such as setting parameters and control parameters for controlling the respective components of the processing module PM. The processing conditions include, for example, parameter values such as a flow rate ratio of a processing gas, a pressure in a processing chamber, a high frequency power, and the like. The programs or the processing conditions may be stored in a hard disk or a semiconductor memory, or may be set in a predetermined position in the storage unit 31 while being stored in a portable computer-readable storage medium such as a CD-ROM, a DVD, or the like.

The controller 30 executes a desired process in the processing module PM by reading a desired program and processing conditions from the storage unit 31 based on an instruction inputted through the input/output interface 33 and controlling the respective components. The processing conditions can be modified by a manipulation from the input/output interface 33. In addition, a separate controller may be provided for each processing module PM, and the entire system 1 can be controlled by communication between each controller and a host device.

(Examples of Lifter Pins and Driving Mechanisms)

Figure 3:
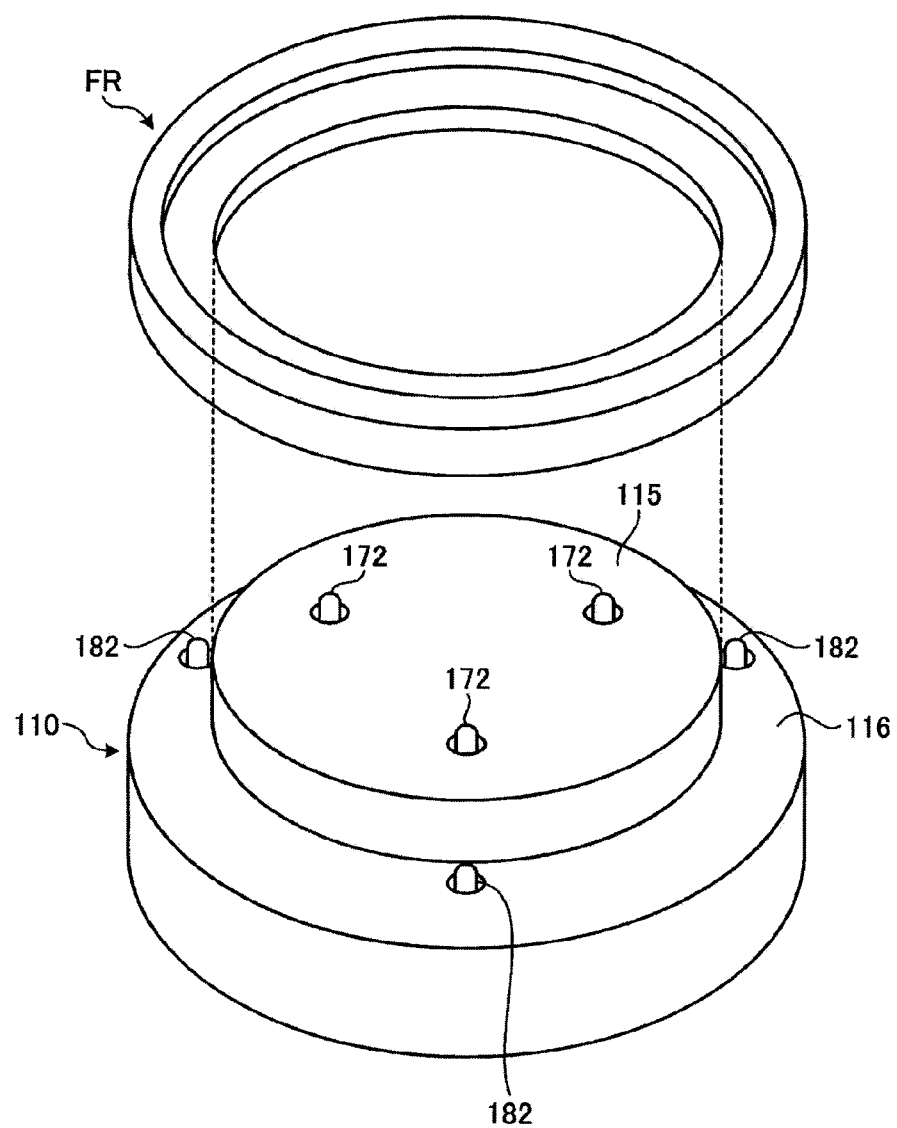
FIG. 3 is a perspective view of a configuration of a susceptor shown in FIG. 2.

As shown in FIG. 3, the susceptor 114 of the processing module PM is provided with first lifter pins 172 that can protrude beyond and retract below the substrate mounting surface 115, and second lifter pins 182 that can protrude beyond and retract below the focus ring mounting surface 116. FIG. 3 is a perspective view for explaining the configuration of the susceptor 114 shown in FIG. 2. Specifically, as shown in FIG. 2, the first lifter pins 172 are driven by a first driving mechanism (DM) 170 to lift the wafer W from the substrate mounting surface 115. The second lifter pins 182 are driven by a second driving mechanism (DM) 180 to lift the focus ring FR from the focus ring mounting surface 116.

The first driving mechanism 170 and the second driving mechanism 180 may be a motor such as a DC motor, a stepping motor, or a linear motor, a piezo actuator, an air driving mechanism, or the like. The first driving mechanism 170 and the second driving mechanism 180 have driving accuracy suitable for the transfer of the wafer W and the transfer of the focus ring FR 1, respectively.

The insulator 112 for supporting the susceptor 114 of the processing module PM is formed in an annular shape. The first lifter pins 172 extend vertically upward from positions below the susceptor 114 surrounded by the insulator 112 and can protrude beyond or retract below the substrate mounting surface 115 that is the top face of the electrostatic chuck 120. The first lifter pins 172 are inserted into holes formed through the susceptor 114 and the electrostatic chuck 120, and are lifted from the substrate mounting surface 115 as shown in FIG. 3 under the driving control of the first driving mechanism 170. The first driving mechanism 170 may be connected to an annular base on which the first lifter pins 172 are disposed at equal intervals, and drive the first lifter pins 172 via the annular base. The number of the first lifter pins 172 is not limited to three. The first lifter pins 172 are disposed to avoid interference with the VTM arm 15 at the time of loading and unloading the wafer W.

The second lifter pins 182 extend vertically upward from positions below the susceptor 114 and can protrude beyond or retract below the focus ring mounting surface 116. The second lifter pins 182 are inserted into holes extending from the position below the susceptor 114 to the focus ring mounting surface 116, and are lifted from the focus ring mounting surface 116 as shown in FIG. 3 under the driving control of the second driving mechanism 180. The second driving mechanism 180 may be connected to an annular base on which the second lifter pins 182 are disposed at equal intervals, and drive the second lifter pins 182 via the annular base. A plurality of second driving mechanisms 180 may be provided to individually drive the second lifter pins 182. The number of the second lifter pins 182 is not limited to three. The second lifter pins 182 are disposed to avoid interference with the VTM arm 15 at the time of loading and unloading the focus ring FR. The base connected to the second driving mechanism 180 has a diameter greater than that of the base connected to the first driving mechanism 170, and is located at an outer side of the base connected to the first driving mechanism 170. Accordingly, the first driving mechanism 170 and the second driving mechanism 180 can raise and lower the first lifter pins 172 and the second lifter pins 182, respectively, without interfering with each other.

With the first driving mechanism 170 configured as described above, the wafer W can be raised from the electrostatic chuck 120 by lifting the first lifter pins 172. Further, with the second driving mechanism 180, the focus ring FR can be raised from the focus ring mounting surface 116 by lifting the second lifter pins 182.

In the example of FIG. 2, the focus ring FR is formed as one integral member. However, the focus ring FR may be divided into two or more parts. For example, the focus ring FR may have an inner part and an outer part such that the outer part is separately provided from the inner part that is relatively easier to be eroded. In this case, only the inner part of the focus ring may be lifted and replaced by the second lifter pins 182.

(Mode Setting)

The system 1 of the present embodiment having the above-described configuration is configured to set the following modes.

(1) Access mode to load port LP
(2) Maintenance mode of respective components
(3) Processing mode of processing module PM (1) Access Mode to Load Port LP In the access mode, whether or not to accept automatic installation of the FOUP on the load port LP is set. A manual mode and an auto mode are set as the access mode. In the manual mode, the system 1 performs installation and removal of the FOUP based on an instruction input from an operator. In the auto mode, the system 1 performs the installation and the removal of the FOUP without the instruction input from the operator.

For example, in the manual mode, the system 1 does not accept the installation and the removal of the FOUP using overhead hoist transfer (OHT). When the operator inputs an instruction in the manual mode, the system 1 accepts the installation and the removal of the FOUP using an automated guided vehicle (AGV). On the other hand, in the auto mode, the system 1 accepts the installation and the removal of the FOUP using the OHT without the instruction input from the operator.

The manual mode is selected when it is required to install or remove the FOUP under the control of the operator. In the present embodiment, the installation and the removal of the FR FOUP can be performed only when the manual mode is selected.

(2) Maintenance Mode of Respective Components

The maintenance mode is set when the normal processing (processing of a product wafer W) of the respective components of the system 1 is stopped and a maintenance operation is performed. The maintenance mode can be set for a set of modules that are operated together. For example, the atmospheric-pressure transfer chamber 20 and the load ports LP1 to LP5 can be collectively set to either a normal processing mode or the maintenance mode.

In the normal processing mode, the respective components of the system 1 are automatically operated based on a preset processing sequence. On the other hand, in the maintenance mode, the respective components of the system 1 are operated based on an operator's instruction.

(3) Processing Mode of Processing Module PM

In the processing mode of the processing module PM, whether or not to perform the processing of the product wafer W, for example, the plasma processing is determined. A production mode and a non-production mode can be set as the processing mode. In the production mode, the system 1 can perform the plasma processing on the product wafer W in the processing module PM. On the other hand, in the non-production mode, the system 1 cannot perform the plasma processing on the product wafer W in the processing module PM. In the system 1 of the present embodiment, the operation mode of the processing module PM in which a consumable is disposed is switched to the non-production mode when replacing the consumable. After the replacement of the consumable, the operation mode of the processing module PM is switched to the production mode and the plasma processing of the product wafer is resumed.

(Example of Sequence of Transfer Process According to an Embodiment)

Figure 4:
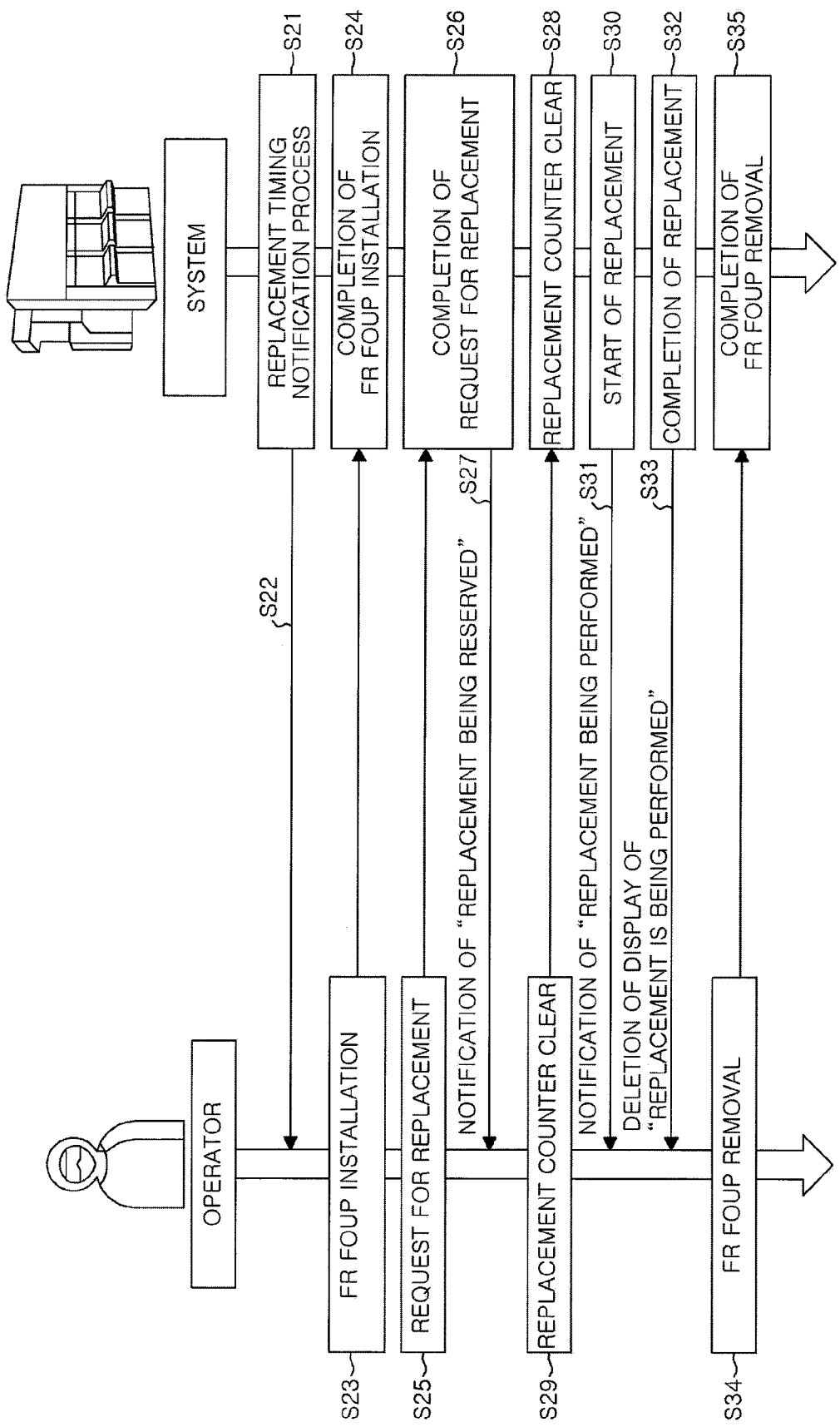
FIG. 4 explains a sequence of consumable transfer processes according to an embodiment.

FIG. 4 shows a sequence of a consumable transfer process according to an embodiment. A left side of FIG. 4 shows processes performed by an operator, and a right side of FIG. 4 shows processes performed by the system 1 (controller 30). Some or all of the processes performed by the operator in FIG. 4 may be automatically performed by the respective components of the system 1.

Figure 5:
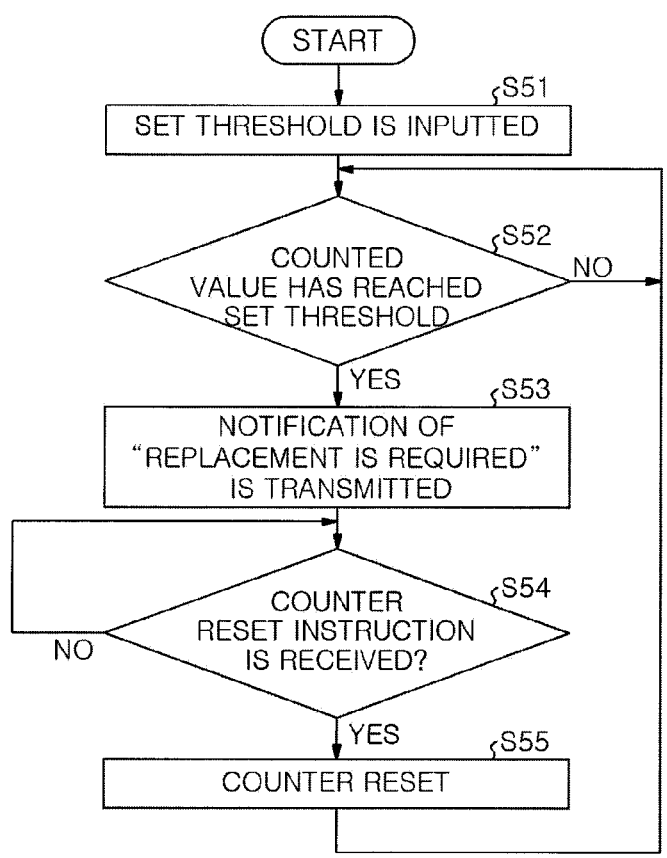
FIG. 5 is a flowchart showing an example replacement timing notification process in the system according to the embodiment.

First, the system 1 performs a replacement timing notification process for a consumable (see step S21 and FIG. 5). For example, the system 1 determines whether or not to replace the focus ring FR. If it is determined that the replacement of the focus ring FR is required, the system 1 notifies the operator that the replacement of the focus ring FR is required (step S22). For example, the system 1 displays information indicating that the replacement of the focus ring FR is required on the display unit 34 of the controller 30.

The operator who has checked the information checks whether or not the FR FOUP has been installed on the load port LP of the system 1. When the FR FOUP is not installed, the operator performs an FR FOUP installation process (see step S23 and FIG. 6).

The system 1 detects the installation of the FR FOUP using the sensor, the reading unit, or the like, and stores the installation completion of the FR FOUP in the storage unit 31 (see step S24 and FIG. 5). After the FR FOUP is installed, the system 1 notifies the operator that the replacement of the focus ring FR can be reserved. For example, the system 1 displays a screen for accepting the request for replacement on the display unit 34.

The operator inputs a predetermined instruction in the system 1 to reserve the replacement of the focus ring FR (step S25). The system 1 stores the completion of the request for replacement of the focus ring FR in the storage unit 31 in response to the operator's instruction (step S26). Further, the system 1 notifies the operator that the replacement of the focus ring FR is reserved (step S27). For example, the system 1 displays on the display unit 34 that the replacement is reserved.

When the replacement is reserved, the system 1 clears (resets) a counter used for notifying the replacement timing (step S28). The counter clear may be performed by an operator's instruction (step S29), or may be automatically performed by the system 1 when the replacement is reserved.

The system 1 starts the replacement of the focus ring FR when a predetermined condition is satisfied (step S30). When the replacement of the focus ring FR is started, the system 1 notifies the operator that the replacement is being performed (step S31). For example, the system 1 displays on the display unit 34 that the replacement is being performed.

When the replacement of the focus ring FR is completed (step S32), the system 1 notifies the operator of the completion of the replacement (step S33). For example, the system 1 deletes the display indicating that the replacement is being performed on the display unit 34.

When there is no unused focus ring FR in the FR FOUP, the operator performs the FR FOUP removal process (step S34). When the completion of the removal process is detected, the system 1 completes the processing (step S35). The above-described sequence is the sequence of the consumable transfer process in the system 1. However, the sequence of the processes shown in FIG. 4 is an example, and the steps may be executed in a different order from that shown in FIG. 4, or other processes may be additionally performed.

(Example of Display Screen)

The display unit 34 of the system 1 configured as described above displays a state of each processing module PM or the like on the screen. The display unit 34 displays, for example, a graphical user interface (GUI) screen. The operator can set the processes of the respective components or the replacement timing of the consumable by performing an input operation while monitoring the GUI displayed on the display unit 34.

The display unit 34 displays the load ports LP1, LP3, and LP5 on which wafer FOUPs can be mounted and the load ports LP2 and LP4 on which both of the wafer and the FR FOUP can be mounted among the load ports LP1 to LP5 in a distinguishable manner.

Further, the display unit 34 displays the load port LP to which the wafer FOUP is connected and the load port LP to which the wafer FOUP is not connected in a distinguishable manner. Moreover, the display unit 34 displays the load port LP to which the FR FOUP is connected and the load port LP to which the FR FOUP is not connected in a distinguishable manner.

The display unit 34 displays the number of wafers W accommodated in the wafer FOUP connected to the load port LP and the accommodation positions of the wafers. Further, the display unit 34 displays the number of processed wafers W and the number of unprocessed wafers W among the wafers W accommodated in the wafer FOUP in a distinguishable manner. Moreover, the display unit 34 displays the number of focus rings FR accommodated in the FR FOUP connected to the load port LP. The display unit 34 also displays the number of unused focus rings FR and the number of used focus rings FR among the focus rings FR accommodated in the FR FOUP in a distinguishable manner.

The display unit 34 also displays processing conditions such as various modes and recipes set for the processing modules PM. The display unit 34 switches the display screen in response to an operator's instruction. The operator can switch and display an individual screen for each processing module PM, an entire screen for displaying the entire state of the system 1 and the like on the display unit 34 by inputting an instruction.

(Example of Sequence of Replacement Timing Notification Process)

Hereinafter, the processes shown in FIG. 4 will be described in detail. First, a replacement timing notification process (step S21) will be described.

As described above, the system 1 according to the embodiment determines whether or not to replace the focus ring FR. When the system 1 determines that the replacement of the focus ring FR is required, the system 1 notifies the operator that the replacement of the focus ring FR is required.

Here, the system 1 determines whether or not to replace the focus ring FR based on a predetermined parameter. The system 1 determines that the replacement of the focus ring FR is required when a preset parameter has reached a threshold.

For example, in the system 1, parameters for determination, thresholds of the parameters, and the like are stored in advance in the storage unit 31 of the controller 30. The parameters include, for example, the number of executions of the plasma processing performed in the processing module PM after the replacement of the focus ring FR, a period of time of the plasma processing (discharge time), the number of processed wafers W, a period of time in which the focus ring FR is exposed to plasma, and the like. For example, the parameter may be the number of executions of the plasma processing after the replacement of the focus ring FR, and a threshold at this time may be set to 4000. Different parameters and thresholds may be set for multiple types of consumables. Parameters and thresholds may be set in association with other maintenance items such as cleaning or maintenance for preventing re-greasing of components, in addition to the replacement of the consumable. When the processing modules PM have the same consumable, different parameters and thresholds may be set for each processing module PM. Parameters and thresholds may be set in the system 1 in advance, or may be set and inputted by the operator. Further, the system 1 may be configured to display information corresponding to a notification received from an external device, for example, a host device, without determining the maintenance execution timing.

FIG. 5 is a flowchart showing an example of a sequence of the replacement timing notification process in the system 1 of the embodiment. First, the operator inputs parameters used for determining the replacement timing and thresholds of the parameters to the system 1. The system 1 sets the parameters and the thresholds based on the operator's input (step S51). Then, the system 1 counts a parameter, for example, the number of processed wafers W. The system 1 determines whether or not the counted value has reached a set threshold (step S52). When it is determined that the counted value has not reached the threshold (NO in step S52), the system 1 repeats the determination of step S52. On the other hand, when it is determined that the counted value has reached the threshold (YES in step S52), the system 1 transmits a notification indicating that the replacement is required (step S53). For example, the system 1 displays a notification of replacement timing on the display unit 34. Then, the system 1 determines whether or not an instruction for the counter reset is received (step S54). When it is determined that the counter reset instruction is not received (NO in step S54), the system 1 repeats the determination of step S54. On the other hand, if it is determined that the counter reset instruction is received (YES in step S54), the system 1 resets the counter (step S55). Then, the system 1 returns to step S52 and repeats the steps S52 to S55.

(Example of Sequence of FR FOUP Installation Process)

Figure 6:
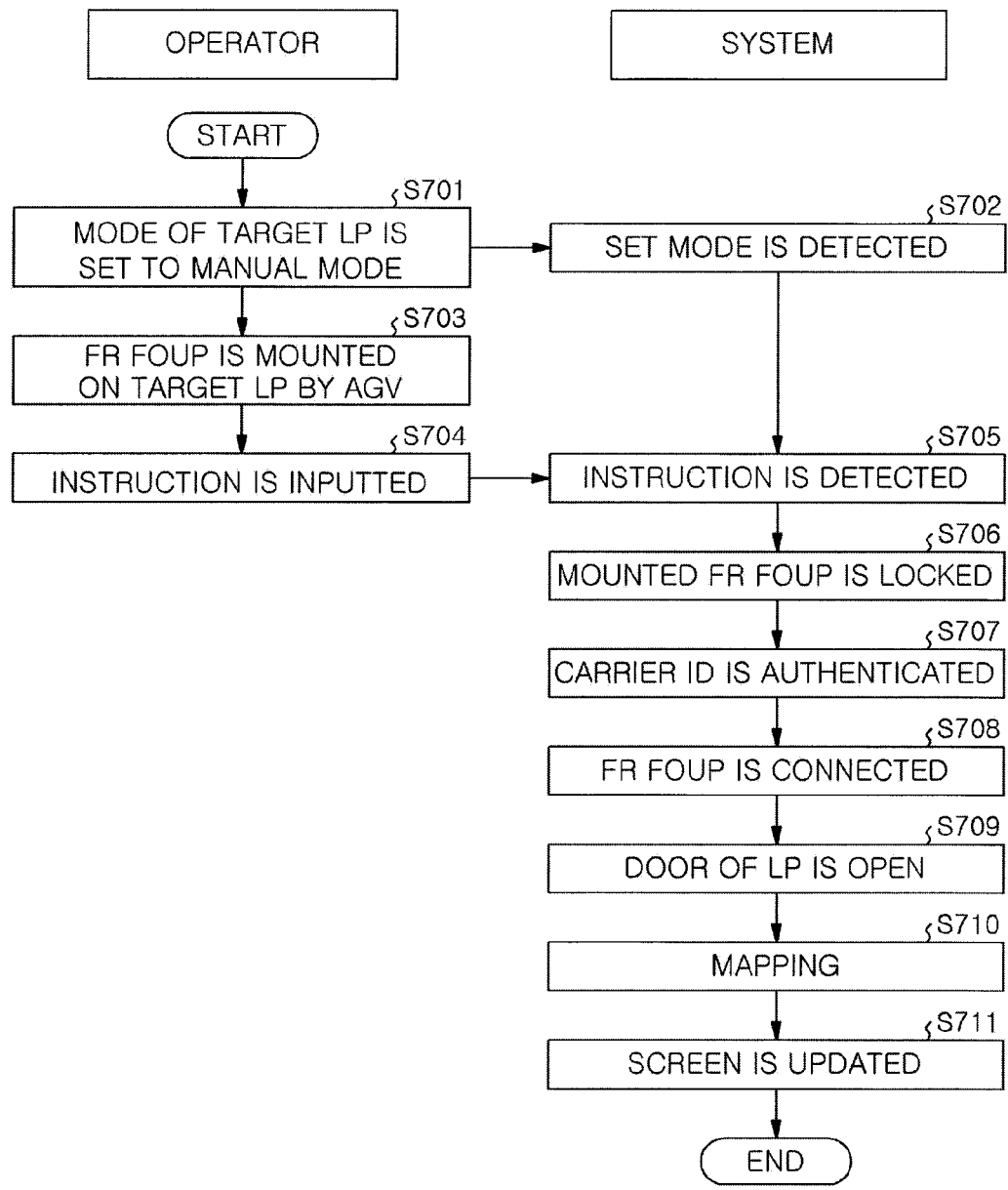
FIG. 6 is a flowchart showing an example FR FOUP installation process in the system according to the embodiment.

Next, an example of a sequence of an FR FOUP installation process (steps S23 and S24 in FIG. 4) will be described. FIG. 6 is a flowchart showing an example of the sequence of the FR FOUP installation process in the system 1 according to the embodiment.

As described above, the system 1 according to the embodiment displays the load ports LP2 and LP4 on which both of the wafer FOUP and the FR FOUP can be mounted, and the load ports LP1, LP3 and LP5 on which the wafer FOUP can be mounted in distinguishable manner. For example, the display unit 34 displays the load port LP on which the FR FOUP can be mounted and the load port LP on which the wafer FOUP can be mounted in different colors.

First, the operator specifies a target load port (for example, load port LP4), on which the FR FOUP is to be mounted, on the screen displayed by the display unit 34 of the system 1. Then, the operator sets the access mode of the target load port LP4 to the manual mode (step S701).

When the operator sets the load port LP4 to the manual mode, the system 1 detects the set mode (step S702) and switches the access mode in association with the load port LP4 stored in the storage unit 31 to the manual mode.

Next, the operator operates, for example, the AGV to mount the FR FOUP on the load port LP4 that is the target load port (step S703). Then, the operator inputs an FR FOUP installation instruction to the system 1 (step S704). The system 1 detects the instruction (step S705).

When the instruction is detected, first, the system 1 locks the FR FOUP to the load port LP4 (step S706). When the FR FOUP is locked to the load port LP4, the reading unit of the load port LP4 reads the carrier ID of the FR FOUP. The carrier ID read by the reading unit is transmitted to the processing unit 32 of the controller 30. The processing unit 32 determines whether or not the carrier ID is the carrier ID of the FR FOUP and authenticates the carrier ID (step S707). Since the load port LP4 is used for the FR FOUP, when the carrier ID is a carrier ID of a wafer FOUP, the processing unit 32 notifies the operator that the installation is not possible. For example, the processing unit 32 causes the display unit 34 to display the notification indicating that installation is not possible. On the other hand, when the read carrier ID is the carrier ID of the FR FOUP, the processing unit 32 authenticates the carrier ID. The authenticated carrier ID is stored in the storage unit 31 to correspond to the load port LP4. Further, the processing unit 32 sets a threshold of the mapping sensor MS based on the authenticated carrier ID.

When the carrier ID is authenticated, the system 1 connects the mounted FR FOUP to the load port LP4 (step S708). When the connection of the FR FOUP is completed, the system 1 opens the lid of the FR FOUP to open the door of the load port LP4 and allows the inside of the FR FOUP to communicate with the inside of the atmospheric-pressure transfer chamber 20 (step S709). When the lid of the FR FOUP is opened, the mapping sensor MS performs mapping of the focus ring FR in the FR FOUP (step S710). The mapping sensor MS detects the positions and the number of the focus rings FR in the FR FOUP. At this time, the mapping sensor MS performs detection based on calibration (calibration reference value and threshold value) suitable for the size of the focus ring FR. The mapping sensor MS notifies the controller 30 of the detected positions and the detected number of the focus rings FR. The controller 30 stores the notified positions and the notified number of the focus rings FR in the storage unit 31. Then, the controller 30 updates the screen by displaying the positions and the number of the focus rings FR on the display unit 34 (step S711). In this manner, the FR FOUP installation process is completed.

In the case of installing the FR FOUP, the display unit 34 updates the display screen based on each stage of the installation process. The display unit 34 displays the load port (first state) on which the FR FOUP is not yet installed and the load port (second state) where the FR FOUP is connected but the mapping of the focus ring FR is not completed in a distinguishable manner. Further, the display unit 34 displays the load ports in the first state and the second state and the load port (third state) where the FR FOUP is connected and the mapping of the focus ring FR is completed in a distinguishable manner.

(Example of Sequence of FR FOUP Removal Process)

Figure 7:
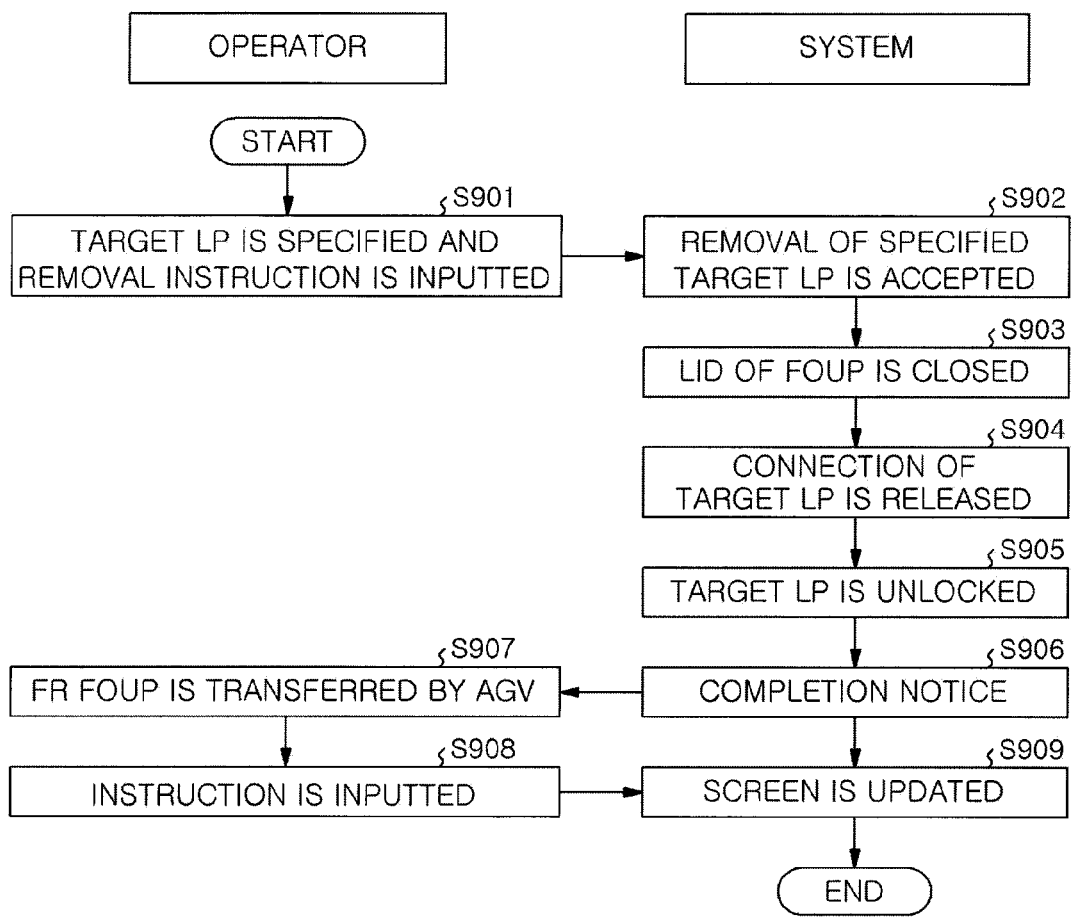
FIG. 7 is a flowchart showing an example FR FOUP removal process in the system according to the embodiment.

Next, an example of a sequence of a FR FOUP removal process (steps S34 and S35 in FIG. 4) will be described. FIG. 7 is a flowchart showing an example of the sequence of the FR FOUP removal process in the system 1 according to the embodiment.

First, the operator specifies a target load port (for example, load port LP4) on the display screen. Then, the operator inputs an instruction to remove the FR FOUP (step S901).

The system 1 receives the instruction from the operator (step S902). When the instruction is received, first, the system 1 closes the lid of the target FR FOUP (step S903). Then, the system 1 releases the connection between the FR FOUP and the load port LP4 (step S904). Next, the system 1 unlocks the FR FOUP (step S905). When the FR FOUP is unlocked, the system 1 notifies the operator of the completion of the FR FOUP removal (step S906). For example, the system 1 displays the completion of the FR FOUP removal on the display unit 34. The operator that has received the notification from the system 1 operates the AGV to remove the FR FOUP from the load port LP4 and transfer the FR FOUP (step S907). When the transfer of the FR FOUR is completed, the operator inputs a predetermined instruction to the system 1 (step S908). When the instruction from the operator is received, the system 1 stores the completion of the FR FOUP removal in the storage unit 31 and updates the screen (step S909). In this manner, the FR FOUP removal process is completed.

The display unit 34 may display the load port LP (fourth state) from which the FOUP is being removed to be distinguished from the load port in any of the first to the third states.

(First Modification of FR FOUP Installation Process)

In the above description, the reading unit of the load port LP reads the carrier ID of the FR FOUP, and the processing unit 32 performs authentication and stores the authentication result in the storage unit 31. However, the carrier ID may not be assigned in advance to each FOUP. Therefore, the system 1 may be configured such that the operator can input the carrier ID at the time of installing the FOUP.

For example, information on a carrier ID input screen to which an operator's input instruction is inputted is stored in advance in the storage unit 31. When the processing of FIG. 6 is started and the operator inputs an FOUP installation instruction to the system 1 (step S704), the system 1 executes steps S705 and S706. Then, in step S707, the system 1 displays the carrier ID input screen instead of reading the carrier ID. The operator inputs information for specifying a target load port LP and a carrier ID of a FOUP that is being installed on the target load port LP on the carrier ID input screen. When the carrier ID is inputted on the carrier ID input screen, the processing unit 32 identifies whether or not the carrier ID is an FR FOUP ID or a wafer FOUP ID. The identification result is stored in the storage unit 31. As described above, the system 1 displays the carrier ID input screen, receives the input of the carrier ID, and authenticates the carrier ID, instead of executing step S707 in the processing shown in FIG. 6. The processes after the input and the authentication of the carrier ID are the same as those shown in FIG. 6 (steps subsequent to step S708).

Alternatively, in step S707, the carrier ID input screen may be displayed when the system 1 fails to read the carrier ID.

(Second Modification of FR FOUP Installation Process)

In the above description, the system 1 distinguishes the FR FOUP and the wafer FOUP based on the carrier ID. However, the system 1 is not limited thereto, and may be configured to distinguish the FR FOUP and the wafer FOUP based on an operator's instruction.

For example, as in the first modification, information on an input screen to which an operator's input instruction is inputted is stored in advance in the storage unit 31. When the processing shown in FIG. 6 is started and the operator inputs a FOUP installation instruction to the system (step S704), the system 1 executes steps S705 to 706. Then, in step S707, the system 1 displays the input screen instead of reading the carrier ID. Unlike the first modification, the input screen of the second modification causes the operator to specify types of FOUPs. On the input screen, the operator inputs information for specifying whether the FOUP that is being installed on the load port is a wafer FOUP or an FR FOUP. For example, the system 1 displays the type of the FOUP and the carrier ID input screen and receives the input instructions, instead of executing step S707 in the processing shown in FIG. 6. The subsequent processes are the same as those shown in FIG. 6 (steps subsequent to step S708).

Alternatively, the input screen of the second modification may be displayed when the system 1 fails to read the carrier ID. Further, the input screen of the second modification may be displayed when the information inputted on the carrier ID input screen of the first modification 1 is invalid.

With the above configuration, even when a FOUP with no carrier ID is installed or when the operator makes an input error, the system 1 can notify the operator and proceed the processing without delay.

(Example of Sequence of Replacement Request Process)

Next, an example of the sequence of the focus ring FR replacement request process (steps S25 to S27 in FIG. 4) will be described.

Here, the replacement request process denotes a process of instructing the system 1 to replace a consumable such as the focus ring FR or the like that requires the replacement. In the present embodiment, the system 1 replaces the consumable when the replacement is previously reserved by the operator. However, the system 1 may be configured to automatically start the replacement process when the replacement is required. In this case, the replacement request process is omitted.

(Timing of Replacement Request Process)

In the present embodiment, the replacement request process can be performed when the installation of the FR FOUP on the load port LP is completed. When the FR FOUP is not installed on the load port LP, the system 1 is not allowed to perform the replacement request process. If the operator attempts to perform the replacement request process in a state where the FR FOUP is not installed on the load port LP, error information is displayed by the system 1.

Figure 8A:
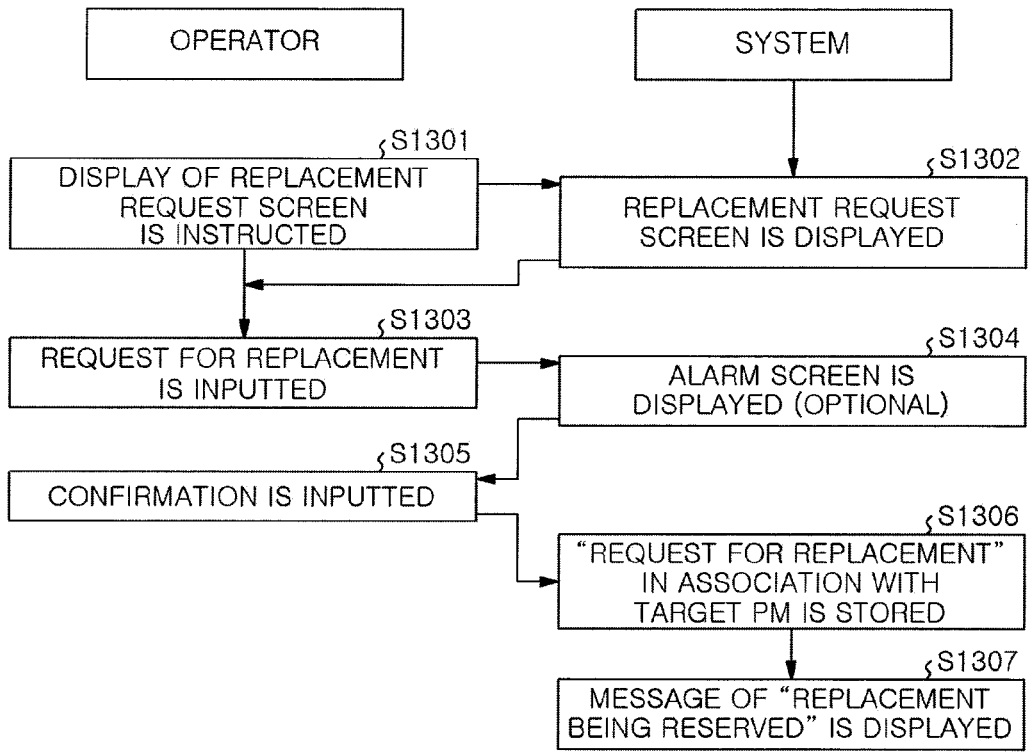
FIG. 8A is a flowchart showing an example process of request for replacement in the system according to the embodiment.

FIG. 8A is a flowchart showing an example of a sequence of the replacement request process in the system 1 according to an embodiment. First, the operator inputs an instruction to display a replacement request screen to the system 1 (step S1301). The system 1 displays the replacement request screen in response to the instruction (step S1302). If the FR FOUP is not yet installed, error information is displayed and the processing is completed by the system 1. The replacement request screen displays, for example, consumables requiring the replacement, a list of processing modules PM in which the consumables are disposed, and a replacement request input button in association with one another. When the replacement request screen is displayed, the operator inputs the request for replacement on the replacement request screen (step S1303). For example, the operator presses a predetermined button on the screen. When the operator's input instruction is received, the system 1 displays an alarm screen related to the request for replacement (warning display, step S1304). The alarm screen shows timing of the replacement process, or the like. When the operator inputs a confirmation on the alarm screen (step S305), the system 1 makes the request for replacement. In other words, the system 1 stores the request for replacement in association with the processing module PM that is the replacement target in the storage unit 31 (step S1306). Then, the system 1 displays a message of "replacement being reserved" in association with the processing module PM that is the replacement target on the display unit 34 (step S1307). In this manner, the replacement request process is completed.

Figure 8B:
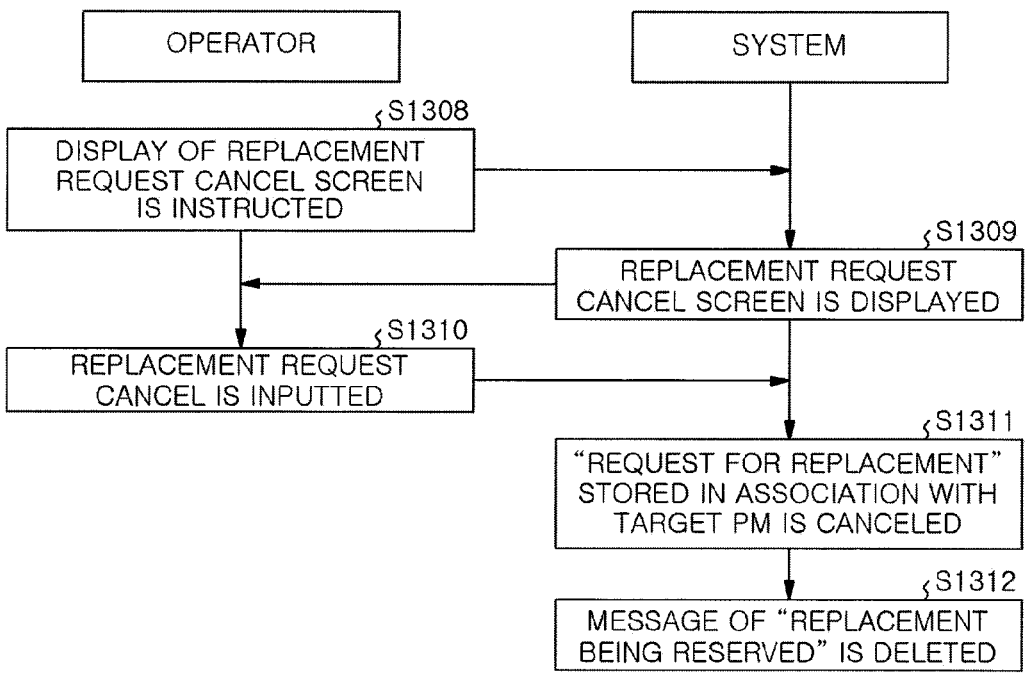
FIG. 8B is a flowchart showing an example cancel process of request for replacement in the system of one embodiment.

FIG. 8B is a flowchart showing an example of a sequence of a replacement request cancel process in the system 1 according to the embodiment. The system 1 performs a replacement request cancel process in response to an operator's input instruction even after the request for replacement.

First, the operator inputs an instruction to display a replacement request cancel screen to the system 1 (step S1308). The system 1 displays the replacement request cancel screen in response to the operator's input instruction (step S1309). The replacement request cancel screen displays a load port LP where the replacement is being reserved. Further, the replacement request cancel screen displays a replacement request cancel input button in association with the load port LP. For example, the replacement request cancel screen displays the processing module PM where the replacement is being reserved, the consumable to be replaced, and the cancel button in association with one other. The operator inputs a replacement request cancel on the replacement request cancel screen (step S1310). For example, the operator presses the cancel button on the replacement request cancel screen. The system 1 cancels the request for replacement stored in association with the corresponding processing module PM and the corresponding consumable from the storage unit 31 in response to the operator's input instruction (step S1311). Then, the system 1 deletes the displayed message of "replacement being reserved" (step S1312). In this manner, the replacement request cancellation process is completed.

(Example of Sequence of Replacement Process)

Next, an example of the sequence of the consumable replacement process (steps S30 to S33 in FIG. 4) will be described. FIG. 9 is a flowchart showing an example of the sequence of the replacement process in the system 1 according to the embodiment.

When the request for replacement is stored in the storage unit 31, first, the system 1 detects a state of a target processing module PM. While the processing is being performed in the target processing module PM, the system 1 is in a standby mode not to perform the replacement process. When the processing in the target processing module PM is completed and the target processing module PM is shifted to an idle state (step S1501), the system 1 changes the mode of the target processing module PM to the non-production mode (step S1502). Then, the system 1 stores the mode change of the target processing module PM in the storage unit 31 (step S1503). The system 1 changes the "replacement being reserved" displayed on the display unit 34 to "replacement being performed" (step S1504). Then, the system 1 performs a replacement path securing process (step S1505). The replacement path securing process will be described in detail later with reference to FIG. 10. Then, the system 1 performs the replacement (step S1506). When the replacement is performed in step S1506, the system 1 performs the transfer of the used focus ring FR from the processing module PM and the transfer of the unused focus ring FR from the FR FOUP concurrently. When the replacement is completed, the system 1 changes the mode of the target processing module PM to the production mode (step S1507). Then, the system 1 stores the mode change of the target processing module PM in the storage unit 31 (step S1508). Next, the system 1 deletes the message "replacement being performed" displayed on the display unit 34 (step S1509). In this manner, the replacement process is completed.

(Replacement Path Securing Process)

Figure 10:
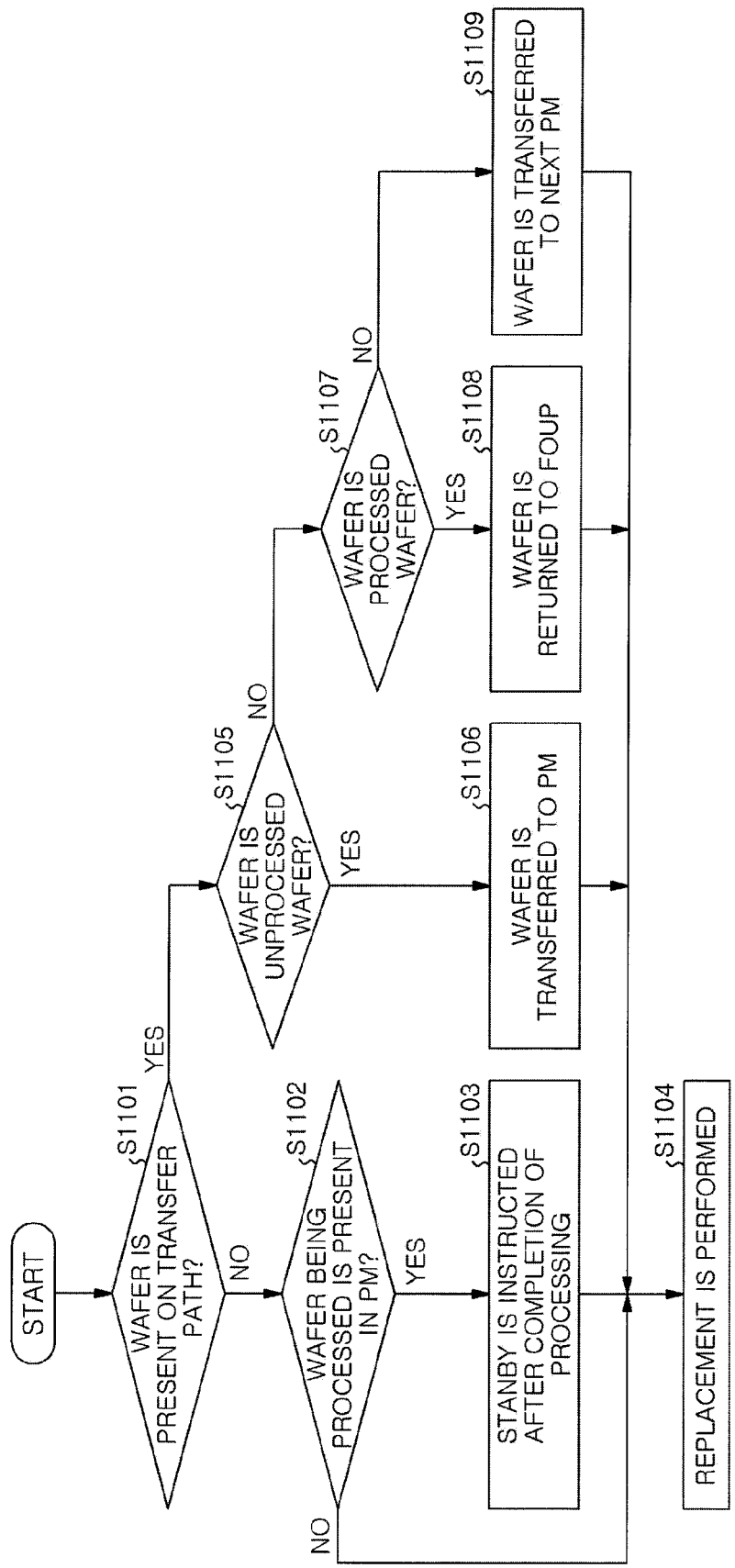
FIG. 10 is a flowchart showing an example replacement path securing process in the system according to the embodiment.

Before the replacement of the focus ring FR is started, the system 1 secures a replacement path in the vacuum transfer chamber 10, the load-lock modules LLM, and the atmospheric-pressure transfer chamber 20 (step S1505 in FIG. 9). FIG. 10 is a flowchart showing a sequence of the replacement path securing process in the system 1 according to the embodiment.

First, the system 1 determines whether or not the wafer W is present on the transfer path (step S1101). The transfer path indicates the inside of the vacuum transfer chamber 10, the load-lock modules LLM, and the atmospheric-pressure transfer chamber 20. When it is determined that there is no wafer W or focus ring FR on the transfer path (NO in step S1101), the system 1 determines whether or not there is a wafer W that is being processed in the processing module PM (step S1102). When it is determined that there is a wafer W that is being processed (YES in step S1102), the system 1 interrupts the processing so that the subsequent processing is not started upon completion of the processing in the processing module PM (step S1103). For example, after the completion of the processing, the system 1 makes the processed wafer W wait in the processing module PM until the replacement process is completed. Then, the system 1 replaces the focus ring FR (step S1104). On the other hand, when it is determined that there is no wafer W that is being processed (NO in step S1102), the system 1 replaces the focus ring FR (step S1104).

When it is determined that there is a wafer W on the transfer path (YES in step S1101), the system 1 determines whether or not the wafer W is an unprocessed wafer (step S1105). If it is determined that the wafer is an unprocessed wafer (YES in step S1105), the system 1 transfers the wafer W to the processing module PM for performing the corresponding processing (step S1106).

When it is determined in step S1105 that the wafer W is a processed wafer (No in step S1105), the system 1 determines whether or not the wafer W has been subjected to the entire processing (step S1107). If it is determined that the wafer W has been subjected to the entire processing (YES in step S1107), the system 1 returns the wafer W to the wafer FOUP in which the wafer W was originally accommodated (step S1108). On the other hand, when it is determined that the wafer W has not been subjected to the entire processing (No in step S1107), the system 1 transfers the wafer to a next processing module PM (step S1109) and then may perform the next processing. Upon completion of steps S1106, S1108, and S1109, the system 1 proceeds to step S1104 and performs the replacement process.

In the example of FIG. 10, an unprocessed wafer W that is once unloaded from the FOUP is transferred to the processing module PM that is a transfer destination without being returned to the wafer FOUP (see step S1106). However, if the processing efficiency is improved by returning the unprocessed wafer W to the wafer FOUP, the unprocessed wafer W may be returned back to the wafer FOUP. After the unprocessed wafer W is loaded into the processing module PM and the gate valve GV is closed, the wafer W may be processed in the processing module PM during the replacement of the focus ring FR. Further, if the wafer W is being processed in the processing module PM during the replacement path securing process, the processing may be continued during the replacement of the focus ring FR. In other words, the loading and unloading of the focus ring FR performed in the vacuum processing chamber (processing module PM) that is the target chamber for the loading and unloading of the focus ring RF and the vacuum processing of the wafer W in another vacuum processing chamber that is different from the target chamber may be performed concurrently.

Further, step S1104 in FIG. 10 may not be started until the temperature of the susceptor 114 (lower electrode) reaches a predetermined temperature. A temperature in the processing module PM is high during the plasma processing of the wafer W. Thus, even when the transfer path is secured, the focus ring FR in the processing module PM may have a high temperature. If the focus ring FR has a high temperature, the focus ring FR may be thermally expanded. Accordingly, when the focus ring FR is lifted from the susceptor 114, the focus ring FR may be brought into contact with the electrostatic chuck 120. Further, if the focus ring FR has a high temperature, the VTM arm 15 and the LM arm 25 may drop the focus ring FR during the transfer operation. Therefore, whether or not the temperature in the processing module PM is a predetermined temperature (normal temperature, for example, 20° C.±15° C.,) is detected before step S1104 in FIG. 10 is started, and the processing waits until the temperature in the processing module PM reaches the predetermined temperature.

(Replacement Process)

Figure 11:
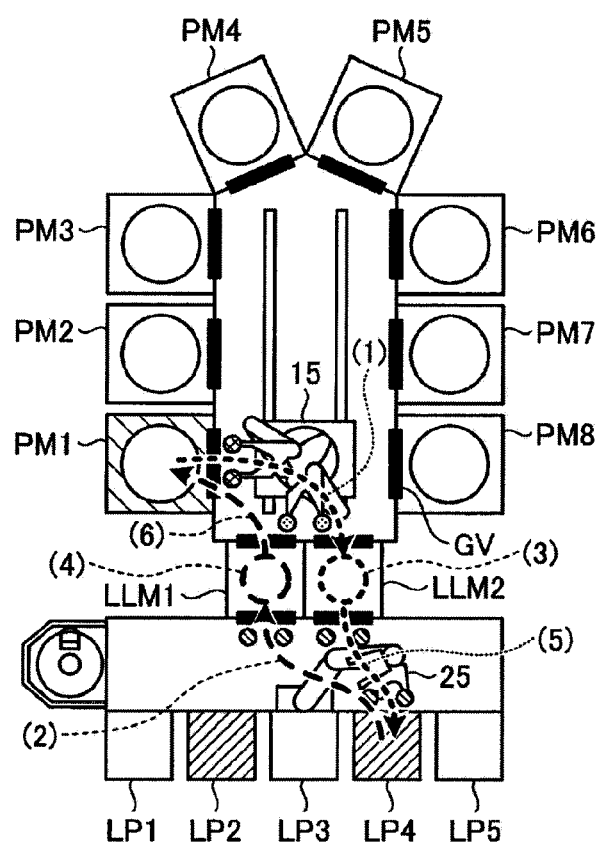
FIG. 11 is a schematic view of a replacement process in the system according to the embodiment.

FIG. 11 explains the replacement process in the system 1 according to the embodiment. When the replacement path for the focus ring FR is secured, the system 1 performs the replacement process (step S1506 in FIG. 9). In the present embodiment, during the replacement process, the system 1 transfers the used focus ring FR and the unused focus ring FR concurrently. In the example of FIG. 11, the used focus ring FR disposed in the processing module PM1 is replaced with an unused focus ring FR in the FR FOUP mounted on the load port LP4.

In this case, first, the system 1 executes steps S1501 to S1505 in FIG. 9 to secure the replacement path. When the replacement path is secured, the system 1 operates the VTM arm 15 to hold the focus ring FR in the processing module PM and operates the LM arm 25 to hold the focus ring FR in the FR FOUP. Then, the system 1 performs the transfer of the used focus ring FR using the VTM arm 15 ((1) in FIG. 11) and the transfer of the unused focus ring FR using the LM arm 25 ((2) in FIG. 11) concurrently. The used focus ring FR is transferred to the load-lock module LLM2 ((3) in FIG. 11). The system 1 opens the load-lock module LLM2 to which the used focus ring FR is transferred to be exposed to the atmosphere. On the other hand, the unused focus ring FR is transferred to the load-lock module LLM1 ((4) in FIG. 11). The system 1 vacuum-evacuates the load-lock module LLM1 to which the unused focus ring FR is transferred. The system 1 operates the VTM arm 15 to hold the unused focus ring FR in the load-lock module LLM1 and operates the LM arm 25 to hold the used focus ring FR in the load-lock module LLM2. Then, the system 1 performs the transfer of the used focus ring FR using the LM arm 25 ((5) in FIG. 11) and the transfer of the unused focus ring FR using the VTM arm 15 ((6) in FIG. 11) concurrently. In this manner, the unused focus ring FR is transferred into the processing module PM1, and the used focus ring FR is transferred into the FR FOUP. During the replacement process, a normal product wafer W is not transferred.

FIG. 12 explains a downtime reduction effect obtained when the focus ring FR is replaced by the system 1 according to the embodiment.

FIG. 12 shows an example of a period of time required to transfer each of the used focus ring FR and the unused focus ring FR. About 25 seconds are required for the LM arm 25 to hold the focus ring FR accommodated in the FR FOUP. Then, about 25 seconds are required for the LM arm to transfer the focus ring FR to the load-lock module LLM. Then, about 10 seconds are required to close the gate valve of the load-lock module LLM and perform vacuum evacuation. Next, about 25 seconds are required for the VTM arm 15 to hold the focus ring FR in the load-lock module LLM. Then, about 25 seconds are required to the VTM arm 15 to transfer the focus ring FR to the processing module PM. Thereafter, about 10 seconds are required to move and place the focus ring FR in position by lowering the second lifter pins 182 holding the focus ring FR in the processing module PM and close the gate valve GV. Then, about 20 seconds are required as a waiting time for consecutive operation of the load-lock module LLM. Therefore, about 140 seconds in total are required to transfer the focus ring FR from the FOUP to the processing module PM.

On the other hand, a period of time required to transfer the used focus ring FR from the processing module PM to the FOUP is as follows. First, about 25 seconds are required for the VTM arm 15 to hold the focus ring FR in the processing module PM. Then, about 25 seconds are required for the VTM arm 15 to transfer focus ring FR to the load-lock module LLM. Then, about 10 seconds are required to switch a reduced atmosphere in the load-lock module LLM where the focus ring FR is disposed to an atmospheric atmosphere. After the atmosphere in the load-lock module LLM is switched to the atmospheric atmosphere, the gate valve of the load-lock module LLM on the atmospheric-pressure transfer chamber 20 side is open. Then, about 25 seconds are required for the LM arm 25 to hold the focus ring FR in the load-lock module LLM. Next, about 25 seconds are required for the LM arm 25 to transfer the focus ring FR into the FOUP on the load port LP. Further, about 20 seconds are required as a waiting time for consecutive operation of the load-lock module LLM. Therefore, about 130 seconds in total are required to retrieve the used focus ring FR.

In the replacement process, if the unused focus ring FR is transferred into the processing module PM after the used focus ring FR is retrieved, about 270 seconds (about 140 seconds+about 130 seconds) are required for the processing. On the other hand, if the retrieval of the used focus rings FR and the transfer of the unused focus ring FR are performed concurrently as in the present embodiment, the replacement process can be completed in about 140 seconds. Therefore, the system 1 of the present embodiment can considerably reduce the downtime for the replacement of the consumable.

Since the depressurized state in the vacuum transfer chamber 10 is maintained during the replacement process, the processing can be continued in the processing modules PM other than the processing module PM that is the replacement target. For example, if 140 seconds or more are required to perform one processing in the processing module PM, the consumable can be replaced without stopping the processing in the processing module PM that is not the replacement target. If less than 140 seconds are required to perform one processing in the processing module PM, the processed wafer W waits in the processing module PM. Therefore, it is possible to prevent contamination or the like caused when both of the product wafer W and the focus ring FR are disposed in the vacuum transfer chamber 10.

(Setting of Transfer Parameters in Replacement Process)

The system 1 according to the embodiment changes the control states of the VTM arm 15, the LM arm 25, the first lifter pins 172, the second lifter pins 182, and the support pins depending on the sizes and the shapes of the wafer W and the focus ring FR during the transfer of the wafer W and the focus ring FR. For example, the system 1 changes the following parameters.

(1) Driving speeds of the VTM arm 15 and the LM arm 25

(2) Driving speeds of the second lifter pins 182 in the processing module PM (1) Driving Speeds of the VTM Arm 15 and the LM Arm 25

During the processing of a normal product wafer W, the VTM arm 15 and the LM arm 25 of the system 1 are controlled to be suitable for the transfer of the wafer W. On the other hand, during the replacement process, the VTM arm 15 and the LM arm 25 are controlled to be suitable for the transfer of the focus ring FR. Therefore, the system 1 switches the driving speeds of the VTM arm 15 and the LM arm 25 before the replacement process is started.

For example, when the replacement process is started (when step S1506 in FIG. 9 is started), the system 1 switches the driving speeds of the VTM arm 15 and the LM arm 25 to be different from those at the time of processing a normal product wafer W. For example, the system 1 switches the driving speeds of the VTM arm 15 and the LM arm to be lower than those at the time of transferring the wafer W. This is because the focus ring FR has a ring shape so that a holding area thereof is small and thus is likely to be misaligned on the VTM arm 15 and the LM arm 25, compared to the wafer W. For example, preset driving speeds of the VTM arm 15 and the LM arm 25 are set in the storage unit 31 of the system 1. Then, the system 1 switches the driving speeds between the replacement process and the transfer of the normal product wafer W. The divining speeds may be set manually by an operator.

(2) Driving Speeds of the Second Lifter Pins in the Processing Module PM

Figure 13A:
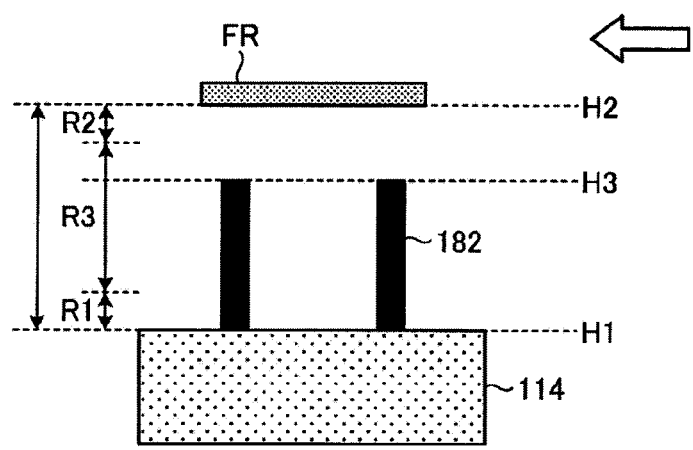
FIG. 13A explains an operation of second lifter pins at the time of loading the focus ring in the system according to the embodiment.

The system 1 sets the driving speeds of the second lifter pins 182 in the processing module PM to be suitable for the transfer of the focus ring FR. For example, the system 1 learns and stores the driving speeds of the second lifter pins 182 in advance by machine learning. FIG. 13A explains the operation of the second lifter pins 182 at the time of loading the focus ring FR in the system 1 according to the embodiment. FIG. 13 explains the operation of the second lifter pins 182 at the time of unloading the focus ring FR in the system 1 according to the embodiment.

The system 1 performs the machine learning for the first and the second lifter pins 172 and 182 and the support pins before the processes are executed. Then, the system 1 sets and stores the maximum speeds and the minimum speeds of the second lifter pins 182 in the processing module PM and pin-up delay for receiving the focus ring FR in the storage unit 31.

The operation of the second lifter pins 182 at the time of loading the focus ring FR will be described. The second lifter pins 182 are accommodated in the susceptor 114 and vertically moved at the time of loading/unloading the focus ring FR. Here, the top face position of the susceptor 114 is referred to as "first height H1," and the focus ring transfer position at which the focus ring FR is transferred by the VTM arm 15 is referred to as "second height H2."

Between the first height H1 and the second height H2, the vicinity of the susceptor 114 is referred to as "range R1," and the vicinity of the transfer position is referred to as "range R2" (see FIG. 13A). Here, the vicinity indicates a range of a predetermined distance, for example, 0.5 mm, in the vertical direction. Here, the predetermined distance is a distance for controlling impact that is generated when the focus ring FR and the second lifter pins 182 are brought into contact with each other or when the focus ring FR and the VTM arm 15 are brought into contact with each other. For example, in the example of FIG. 13A, the range R1 indicates an upward range of a predetermined distance from the top face position of the susceptor 114. The range R1 may be an upward or a downward range of a predetermined distance in the vertical direction from the top face position of the susceptor 114. In the example of FIG. 13A, the range R2 may indicate a downward range of a predetermined distance in the vertical direction from the second height H2 of the focus ring FR. The range R2 may be an upward or a downward range of a predetermined distance in the vertical direction from the second height H2. A range other than the ranges R1 and R2 between the first height H1 and the second height H2 is referred to "range R3."

When the loading/unloading operation is not performed, the second lifter pins 182 are accommodated in the susceptor 114 and the upper ends of the second lifter pins 182 are positioned at or below the first height H1. At the time of loading the focus ring FR, the second lifter pins 182 are driven by the second driving mechanism 180 to protrude from the susceptor 114 and reach a third height H3 lower than the second height H2 (see FIG. 13A). Next, the focus ring FR is mounted on the pick 17a or 17b of the VTM arm 15 and loaded into the processing module PM while maintaining the second height H2. When the focus ring FR mounted on the VTM arm 15 reaches the susceptor 114, the second lifter pins 182 are lifted to the second height H2. At this time, the second lifter pins 182 wait for a predetermined period of time until the VTM arm 15 is stopped and the fluctuation of the focus ring FR is stopped, and then the second lifter pins 182 are lifted. This waiting time is referred to as "pin-up delay." The second lifter pins 182 receive the focus ring FR at the second height H2. Thereafter, the second lifter pins 182 that have received the focus ring FR are lowered and the focus ring FR is mounted on the susceptor 114.

In the case of loading the focus ring FR, the system 1 switches the driving speeds of the second lifter pins 182 to be lower in the range R2 than in the ranges R1 and R3 at the time of upward movement and to be lower in the range R1 than in the ranges R2 and R3 at the time of downward movement. Accordingly, the impact that is generated by the contact between the second lifter pins 182 and the focus ring FR is suppressed and damages of the focus ring FR is prevented. In the example of FIG. 13A, the range R1 is positioned above the top face of the susceptor 114. However, the range R1 may be set above and below the top face of the susceptor 114. Similarly, the range R2 may be set above and below the height H2.

Figure 13B:
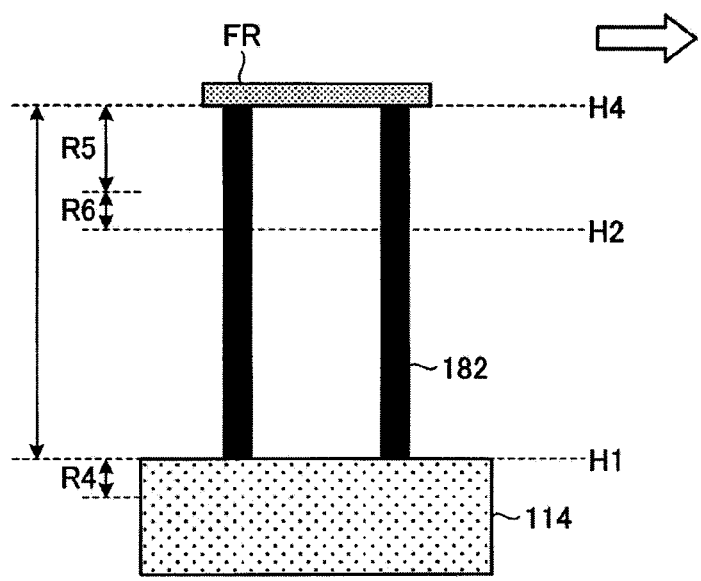
FIG. 13B explains an operation of the second lifter pins at the time of unloading the focus ring in the system according to the embodiment.

Next, the operation of the second lifter pins 182 at the time of unloading the focus ring FR will be described with reference to FIG. 13B. In FIG. 13B, a downward range of a predetermined distance from the top face (H1) of the susceptor 114 in the vertical direction is defined as a range R4, and an upward range of a predetermined distance from the second height H2 in the vertical direction is defined as a range R6. In addition, a range that is not included in the range R6 between the second height H2 and a fourth height H4 is defined as a range R5. The predetermined distances or the ranges are set in the same manner as that in the example of FIG. 13A.

In the case of unloading the focus ring FR, first, the second lifter pins 182 are lifted to the first height H1. When the upper ends of the second lifter pins 182 are brought into contact with the focus ring FR, the second lifter pins 182 are lifted to the fourth height H4 while supporting the focus ring FR. The fourth height H4 is higher in the vertical direction than the second height H2 at which the focus ring FR is transferred. In a state where the focus ring FR is supported by the second lifter pins 182 at the fourth height H4, the pick 17a (or 17b) of the VTM arm 15 enters the processing module PM and is stopped at a position below the focus ring FR. At this time, the pick of the VTM arm 15 is located at the second height H2. As in the case of loading the focus ring FR, the second lifter pins 182 wait for a predetermined period of time until the fluctuation of the VTM arm 15 is stopped, and then the second lifter pins 182 are lowered. Then, the focus ring FR supported on the second lifter pins 182 is transferred to the VTM arm 15. The VTM arm 15 moves from the processing module PM to the vacuum transfer chamber 10 while holding the focus ring FR and unloads the focus ring FR.

In the case of unloading the focus ring FR, the system 1 switches the driving speeds of the second lifter pins 182 to be lower in the range R4 than in the ranges R5 and R6 at the time of upward movement and to be lower in the range R6 than in the ranges R4 and R5 at the time of downward movement. For example, the system 1 sets the driving speeds of the second lifter pins to a first speed in the range R4 and to a second speed higher than the first speed in the ranges R5 and R6 and ranges other than the ranges R4, R5, and R6 at the time of upward movement. Further, the system 1 sets the driving speeds of the second lifter pins to the first speed in the range R6, and to the second speed higher than the first speed in the ranges R4 and R5 and ranges other than the ranges R4, R5, and R6 at the time of downward movement.

In other words, the system 1 switches the driving speeds of the second lifter pins 182 to the first speed that is a relatively low speed between immediately before the second lifter pins 182 are brought into contact with the focus ring FR and when the second lifter pins 182 are brought into contact with the focus ring FR. Further, the system 1 switches the driving speeds of the second lifter pins 182 to the first speed that is a relatively low speed between immediately before the focus ring FR supported by the second lifter pins 182 is brought into contact with the susceptor 114 and the VTM arm 15 and when the mounting of the focus ring FR is completed. The system 1 drives the second lifter pins 182 at the second speed that is a relatively high speed when the focus ring FR is not in contact with other components.

Therefore, the system 1 sets and stores the first speed, the second speed, and the waiting time (pin-up delay) of the second lifter pins 182 in advance by machine learning. For example, the system 1 sets the first speed and the second speed within a range of 1 to 15 mm/sec. For example, the system 1 sets the waiting time of the second lifter pins 182 within a range of 0 to 60.0 sec.

The system 1 can set the driving speeds of the support pins in the load-lock module LLM in the same manner as that for the second lifter pins 182. For example, the driving speeds of the support pins can be set within a range of 1 to 1700 mm/sec.

(Fixing the Transfer Path)

In the present embodiment, as described above, the transfer of the used focus ring FR and the transfer of the unused focus ring FR are performed concurrently (in parallel). Therefore, the system 1 includes at least two load-lock modules LLM. In the system 1, one load-lock module (for example, LLM1) is used for transferring the used focus ring FR, and the other load-lock module (for example, LLM2) is used for transferring the unused focus ring FR.

In order to further improve transfer accuracy, picks of the VTM arm 15 and the LM arm 25 may be specified as a part of the transfer path for transferring the unused focus ring FR. The transfer accuracy refers to the accuracy and stability of the position of the focus ring FR during the transfer operation. If the transfer accuracy is high, a relatively small amount of misalignment occurs between the transferred focus ring FR and the designed transfer path. If the transfer accuracy is low, a relatively large amount of misalignment occurs between the transferred focus ring FR and the designed transfer path. Further, if the transfer accuracy is high, the positional displacement of the focus ring FR for each transfer operation is small, and if the transfer accuracy is low, the positional displacement of the focus ring FR for each transfer operation is large. For example, the system 1 specifies the first pick 17*a* of the VTM arm 15 and the first pick 27*a* of the LM arm 25 to be included in the transfer path of the unused focus ring FR. Further, the system 1 further specifies the load-lock module LLM1 to be included in the transfer path of the unused focus ring FR.

In addition, the system 1 specifies the second pick 17*b* of the VTM arm 15 and the second pick 27*b* of the LM arm 25 to be included in the transfer path of the used focus ring FR. Further, the system 1 further specifies the load-lock module LLM2 to be included in the transfer path of the used focus ring FR. The system 1 stores the specified transfer path in the storage unit 31.

For example, information specifying the first pick 17*a* of the VTM arm 15, the first pick 27*a* of the LM arm 25, and the load-lock module LLM1 are stored as default values for the transfer path of the unused focus ring FR. Further, information specifying the second pick 17*b* of the VTM arm 15, the second pick 27*b* of the LM arm, and the load-lock module LLM2 are stored in the storage unit 31 as default values for the transfer path of the used focus ring FR. At the time of the replacement process, the system 1 determines a transfer path based on the information stored in the storage unit 31.

By specifying the transfer path in the above manner, the system 1 can use a different path depending on each transfer operation and, thus, it is possible to suppress the occurrence of a minute amount of deviation in the transfer accuracy of the focus ring FR. For example, even if the misalignment occurs on each of the first pick 17*a* and the second pick 17*b* of the VTM arm 15, the unused focus ring FR is transferred along the same transfer path, thereby suppressing the decrease in the transfer accuracy. Further, since it is not necessary to precisely control the transfer accuracy of the used focus ring FR, specifying a pick to be included in the transfer path is executed with priority on the unused focus ring FR. However, the transfer path may also be specified for the used focus ring FR.

(Switch Processing Mode)

In the example of FIG. 9, the system 1 switches the operation mode of the target processing module PM to the non-production mode and executes the replacement process, and switches to the production mode after the replacement process is completed. However, the present disclosure is not limited thereto, and the system 1 may be configured not to automatically switch to the production mode but to switch to the production mode in response to an input from the operator after the replacement process is completed.

For example, the operation mode after the completion of the replacement process is set to "non-production mode" as a default mode and stored in the storage unit 31 so that the setting is not automatically changed. With this setting, when the maintenance work of the processing module PM, for example, the seasoning process needs to be executed after the focus ring FR is replaced, it is possible to prevent the wafer W from being automatically loaded into the processing module PM before the maintenance work.

(Cancellation of Replacement Process)

After the system 1 starts the replacement process, the replacement process may not be continued in the case when the focus ring FR falls from the VTM arm 15 or the LM arm 25. Therefore, the system 1 according to the present embodiment may be configured to detect such a case to stop the replacement process.

If the first sensor S1 or the second sensor S2 of the system 1 cannot detect the focus ring FR after the start of the replacement process, the processing unit 32 is notified accordingly. When the processing unit 32 receives the notification, the processing unit 32 stops the operation of the driving system (for example, the VTM arm 15, the LM arm 25, and the like). Then, the processing unit 32 notifies the operator of an operation-stop notification. For example, the processing unit 32 displays the operation-stop notification on the display unit 34.

Upon receiving the operation-stop notification, the operator switches the operation modes of the processing module PM, the vacuum transfer chamber 10, the load-lock modules LLM, and the atmospheric-pressure transfer chamber 20 to the maintenance mode. Then, the operator inputs an instruction from the display unit 34 to thereby stop the replacement process of the system 1. At this time, the system 1 maintains the operation mode of the target processing module PM 1 in the non-production mode (that is, the processing mode in which the product wafer W cannot be processed). Further, the focus ring FR being replaced is not automatically moved, but remains in the state of the operation-stop. This is because the state of the focus ring FR cannot be identified, so that the state of the focus ring FR can only be restored after the operator visually confirms the state of the focus ring FR. After confirming the situation, the operator performs processing of for example, opening the chamber of the processing module PM and installing the focus ring FR. After the restoration is completed, the operator switches the operation modes of the respective modules and chambers from the maintenance modes to the normal processing modes.

Further, the stop of the replacement process may be carried out not only when an abnormality is detected by the system 1 but also arbitrarily executed by the operator. For example, a screen for inputting an instruction of stopping the replacement process may be displayed on the display unit 34. The system 1 is configured so as to stop the operations of the VTM arm 15 and the LM arm 25 in response to the instruction input from the operator. After the operations of the VTM arm 15 and the LM arm 25 are stopped, the operator performs the same process as when the operation-stop notification is received.

Further, in the case when the operator switches the operation mode of the system 1 to the maintenance mode during the replacement request process or during the replacement process and performs a removal of the FR FOUP or an unloading of the focus ring FR in the FR FOUP, the restoration can be carried out in the same manner as described above. Alternatively, as a default setting, the system 1 may be configured so that the removal of the FR FOUP cannot be performed during the replacement process.

(Lifter Pin Maintenance)

The lifter pins for raising and lowering the focus ring FR (the second lifter pins 182 and support pins) provided in the respective components of the system 1 are not generally operated until the replacement process is executed. For this reason, there is a possibility that the second lifter pins 182 and the support pins are fixed to the surrounding structure by the re-greasing or the like. Therefore, the system 1 of the present embodiment may be configured so as to automatically and periodically perform maintenance of the lifter pins.

For example, a counter for determining the maintenance execution timing is provided in the same manner as the counter for notifying the replacement timing. For example, the maintenance execution timing of the second lifter pins 182 is set in association with each processing module PM. For example, the number of processed wafers W can be used as a parameter for the maintenance execution timing of the second lifter pins 182. For example, the maintenance of the second lifter pins 182 is executed when the 1000 wafers W are processed.

Alternatively, the maintenance execution timing may be arbitrarily set, or may be selected from preset parameters by the operator. For example, the operator may select either the number of wafer processing operations (the number of processed wafers) or the RF discharge time as an execution timing determination parameter. A maintenance execution timing of the support pins of each of the load-lock modules LLM can be set in the same manner described above.

The maintenance execution timing is set to be, for example, a timing when the processing of the latest lot is completed after reaching a preset parameter threshold (for example, after 1000 times of wafer processing operations are executed). In the case of performing the maintenance of the second lifter pins 182 or the support pins, the system 1 raises and lowers the second lifter pins 182 or the support pins. If this maintenance timing overlaps with the timing of other processes, the priority is given to other processes, so that the maintenance of the lifter pins or the support pins is executed after the other processes are completed.

(Communication with Host)

Some of the processes described above independently performed by the system 1 may be performed by another apparatus. For example, the controller 30 of the system 1 may be provided independent of other components of the system 1. Further, the system 1 may be configured to be remotely controlled from another apparatus.

For example, a host (server) is disposed separately from the system 1. Then, the plasma processing in each processing module PM may be controlled by the host. In this case, an interruption to the host-side control for the processing module PM occurs due to the replacement process on the system 1 side. Therefore, the system 1 may be configured to send the notification to the host each time the operation mode of the processing module is changed in order to execute the replacement process. During the production mode, the host manages the control of the processing module PM, and during the non-production mode, the host stops the processing of the processing module PM. In this case, the system 1 is configured to notify the host of the mode change in steps S1503 and S1507 in FIG. 9.

(Example of Pick Shape of Transfer Mechanisms)

In the above-described embodiment, the first pick 17*a* and the second pick 17*b* of the VTM arm 15 and the first pick 27*a* and the second pick 27*b* of the LM arm 25 may be configured as follows. Hereinafter, the first pick 17*a* and the second pick 17*b* of the VTM arm 15 and the first pick 27*a* and the second pick 27*b* of the LM arm 25 are collectively referred to as a pick 50. The pick 50 is an example of a holder that is provided at a tip of an arm of a transfer mechanism that transfers the wafer W and the consumable to hold the wafer W and the consumable.

In the above-described embodiment, the VTM arm 15 and the LM arm 25 are configured to be capable of carrying both of the wafer W and the consumable. Hereinafter, a configuration of the pick 50 in the case of transferring the focus ring FR as a consumable will be described as an example.

Figure 14A:
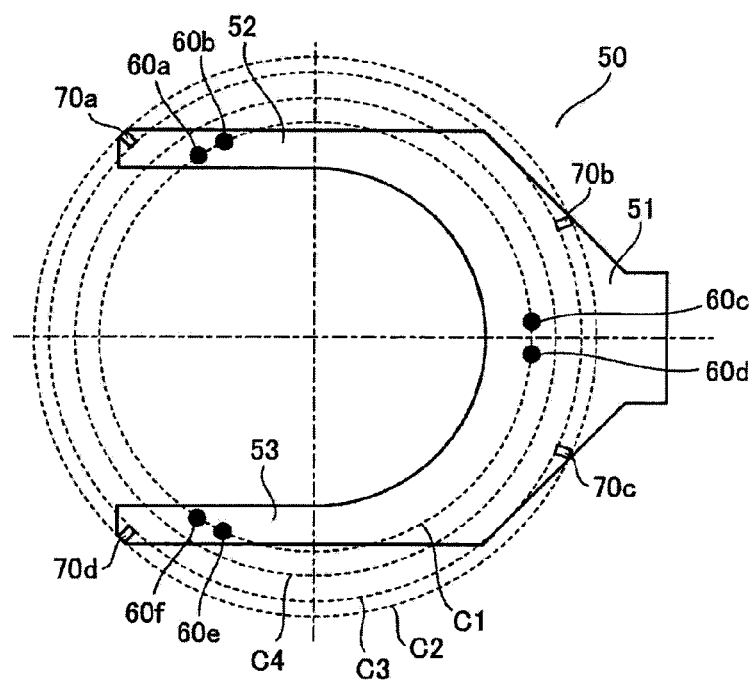
FIG. 14A is a schematic plan view of an example configuration of a pick of the system according to the embodiment.
Figure 14B:
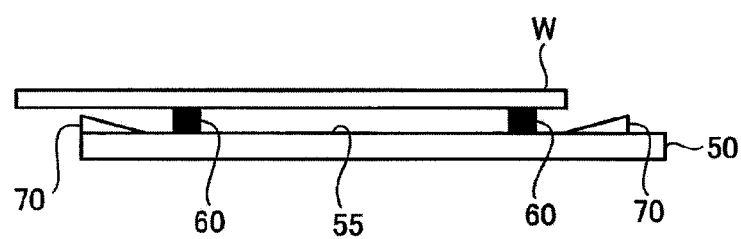
FIG. 14B is a schematic front view of the pick shown in FIG. 14A.

FIG. 14A is a schematic plan view showing an example of the configuration of the pick 50 included in the system 1 according to the embodiment. FIG. 14B is a schematic front view of the pick 50 shown in FIG. 14A. The pick 50 includes a base portion 51 and a first branch portion 52 and a second branch portion 53 that respectively extend from two end portions of the base portion 51 in different directions. The base portion 51, the first branch portion 52 and the second branch portion 53 are configured such that three vertices of a triangle that is centered about the center of the wafer W and touches the outer diameter of the wafer W are formed to be positioned on the base portion 51, the first branch portion 52 and the second branch portion 53, respectively. The shape of the pick 50 is not limited to the bifurcated shape shown in FIG. 14A. The pick 50 may have three or more branch portions. However, the shape of the pick 50 is formed such that when the focus ring FR is placed on the pick 50, a gap is formed between an inner diameter of the focus ring FR and the pick 50 in the plan view.

The pick 50 has a first face 55 on the side that holds the wafer W and the focus ring FR. Six bumps 60*a* to 60*f* for holding the wafer W are disposed on the first face 55. In the case that it is not necessary to distinguish these bumps 60*a* to 60*f*, they are collectively referred to as bump 60. The base portion 51, the first branch portion 52 and the second branch portion 53 each have at least one bump 60. Although FIG. 14A shows six bumps 60, the number of bumps 60 may be less than six or more than six. These bumps 60 are disposed on a first circle C1 depicted on the first face and having a diameter smaller than the inner diameter of the focus ring FR.

The bumps 60 each have a top face at a height h1 from the first face 55. The top faces of the bumps 60 may have any shape. For example, the top faces of the bumps 60 may be substantially parallel to the first face 55, or may have a truncated conical or hemispherical shape.

Four wedged stops 70a to 70d for holding the focus ring FR are also disposed on the first face 55. In the case that it is not necessary to distinguish these stops 70a to 70d, they are collectively referred to as the stop 70. Similar to the bump 60, the base portion 51, the first branch portion 52, and the second branch portion 53 each have at least one stop 70. Although FIG. 14A shows four stops 70, the number of the stops may be less than four or more than four. The outer end of the stop 70 is disposed on a second circle C2 depicted on the first face and having a diameter larger than the outer diameter of the focus ring FR. The second circle C2 is substantially concentric with the first circle C1. The inner edge of the stop 70 is disposed on a third circle C3 having a diameter larger than the inner diameter of the focus ring FR and smaller than the outer diameter of the focus ring FR. Alternatively, the inner edge of the stop 70 may be disposed on a fourth circle C4 having a diameter smaller than the inner diameter of the focus ring FR. The first to fourth circles are substantially concentric.

The inner edge of the stop 70 is disposed on the third circle C3, described above. The outer end of the stop 70 has a top face at a height h2 from the first face 55. The inner edge of the stop 70 has a top face at a height h3 from the first face 55. The heights h1, h2 and h3 have a relation $h1>h2>h3$. The top face with a height h2 of the stop 70 is thus lower than the top face with a height h1 of the bump 60 at any position. As shown in FIG. 14B, the top face of the stop 70 is inwardly sloped from the outer end to the inner edge. The stop 70 is oriented to the center of the circle C1 to C4.

Figure 15A:
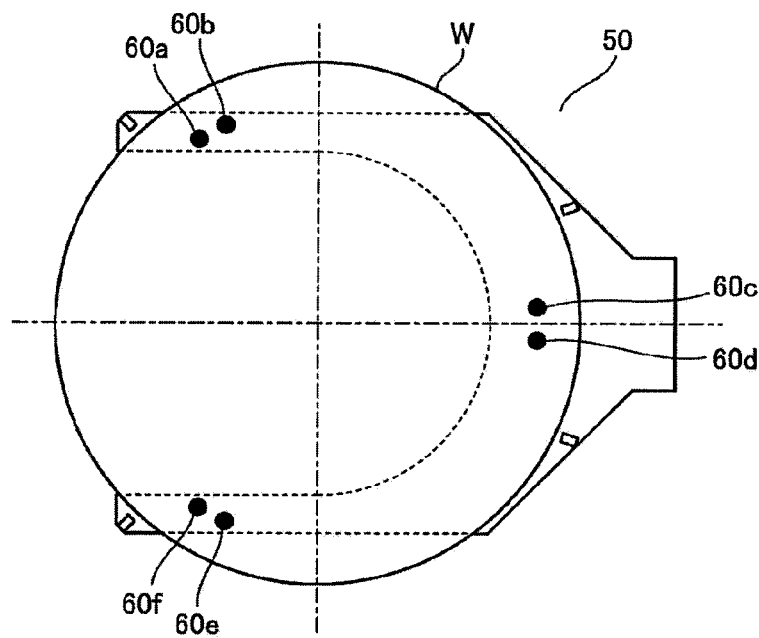
FIG. 15A is a schematic plan view showing the state of a wafer held on the pick shown in FIG. 14A.
Figure 15B:
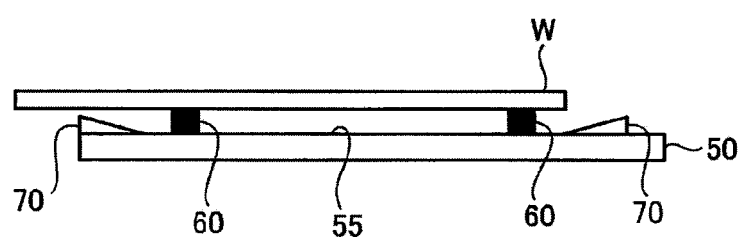
FIG. 15B is a schematic front view of the pick and the wafer shown in FIG. 15A viewed from a horizontal direction.

FIG. 15A is a schematic plan view illustrating a state of the wafer W held on the pick 50 shown in FIG. 14A. FIG. 15B is a schematic front cross-sectional view of the pick 50 and the wafer W shown in FIG. 15A. The pick 50 holds the wafer W on the bumps 60 whereas the wafer W is not in contact with the first face 55. It should be understood that the wafer W is held on the pick 50 whereas the top face of the stop 70, which is lower than the top face of the bump 60, is not in contact with the wafer W.

Figure 16A:
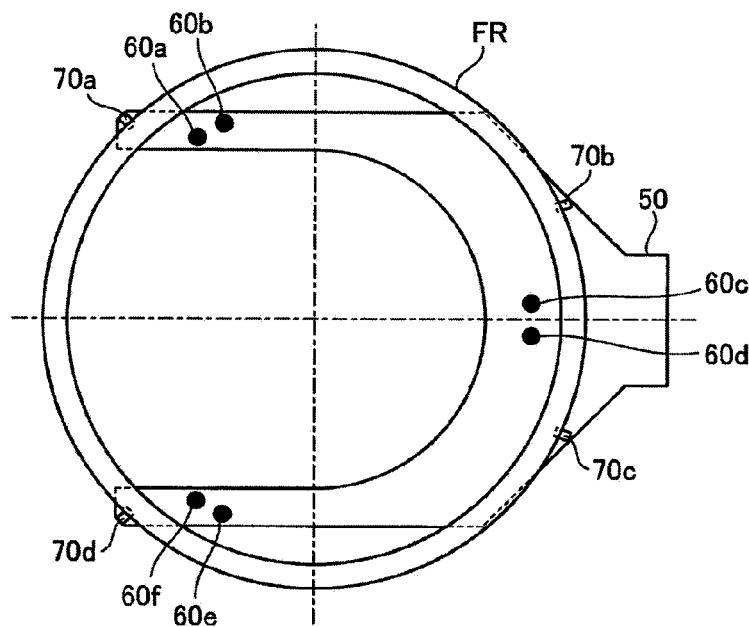
FIG. 16A is a schematic plan view showing the state of the focus ring held on the pick shown in FIG. 14A.
Figure 16B:
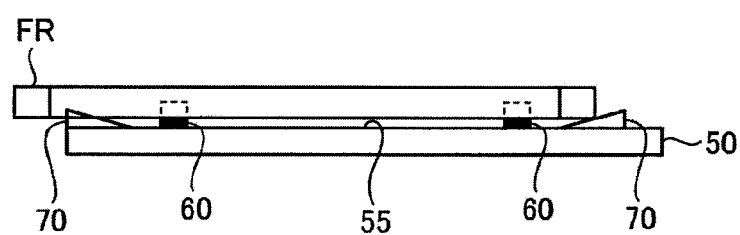
FIG. 16B is a schematic front cross-sectional view of the pick and the focus ring shown in FIG. 16A.

FIG. 16A is a schematic plan view illustrating a state of the focus ring FR held on the pick 50 shown in FIG. 14A. FIG. 16B is a schematic front cross-sectional view of the pick 50 and the focus ring FR shown in FIG. 16A. The pick 50 holds the focus ring FR on the stops 70 whereas the first face 55 is not contact with the focus ring FR. The outer periphery of the focus ring FR is in contact with and supported at an intermediate portion of the inwardly sloped surface of the stop 70. After the focus ring FR is held on the pick 50, the bump 60 is located inside the focus ring FR. The focus ring FR thus does not come into contact with the bump 60 when the focus ring FR is held on the pick 50.

A combination of the bump 60 for holding the wafer W and the stop 70 for holding the focus ring FR enables a single pick 50 to transfer both the wafer W and the focus ring FR.

Since the top face of the bump 60 is higher than the top face of the stop 70, the wafer W in transfer does not come into contact with the pick 50 and thus is protected from contamination or damage. Since the top face of the stop 70 is inwardly sloped, the focus ring FR comes into contact with the pick 50 at a minimized contact area, preventing sticking of the focus ring FR to the pick 50 and thus preventing the misalignment of the focus ring FR during the transfer operation. As a result, the focus ring FR does not jump up during the mounting operation.

It should be noted that the moving speed of the pick 50 for transfer of the focus ring FR is set to be lower than that for transfer of the wafer W.

The bump 60 and the stop 70 may be composed of any material. Examples of such material include rubber and ceramic. It is preferred that the stop 70 be composed of a material having a low coefficient of friction with the focus ring FR to prevent the sticking as described above.

The shape, size, and position of the stop 70 may be modified depending on the inner diameter and the outer diameter of the focus ring FR. For example, to meet a non-flat bottom surface of the focus ring FR, the positions of the outer end and the inner edge of the stop 70 may be adjusted based on the shape of the focus ring FR.

The stop 70 may be integrated with the base portion 51, the first branch portion 52, and the second branch portion 53 of the pick 50. The stop 70 may be composed of the same material as the base portion 51, the first branch portion 52, and the second branch portion 53 of the pick 50. Usable examples of the ceramic described above include titanium and silicon carbide.

The focus ring FR shown in FIG. 3 has a cutout on an inner half of the top face, whereas the focus ring FR shown in FIGS. 16A and 16B does not have such a cutout. Focus rings FR with other shapes can however also transferred by the pick 50.

(Misalignment Detection During Transfer Operation)

As described above, the system 1 according to the embodiment includes the first sensors S1 to S16 for detecting the misalignments of the wafer W and the focus ring FR transferred to the processing module PM. In addition, two first sensors constitute one set and are disposed on the transfer path in the vicinity of the gate valve of each process module PM. Further, the third sensors S20 to S27 in the atmospheric-pressure transfer chamber 20 detect the misalignments of the wafer W and the focus ring FR in the similar manner. Hereinafter, a misalignment detection method that can be commonly applied to the first sensors S1 to S16 and the third sensors S20 to S27 will be described. In the following description, the third sensors S20 and S21 installed in front of the load-lock module LLM1 and the third sensors S24 and S25 installed in front of the load port LP2 will be described as an example.

Figure 17:
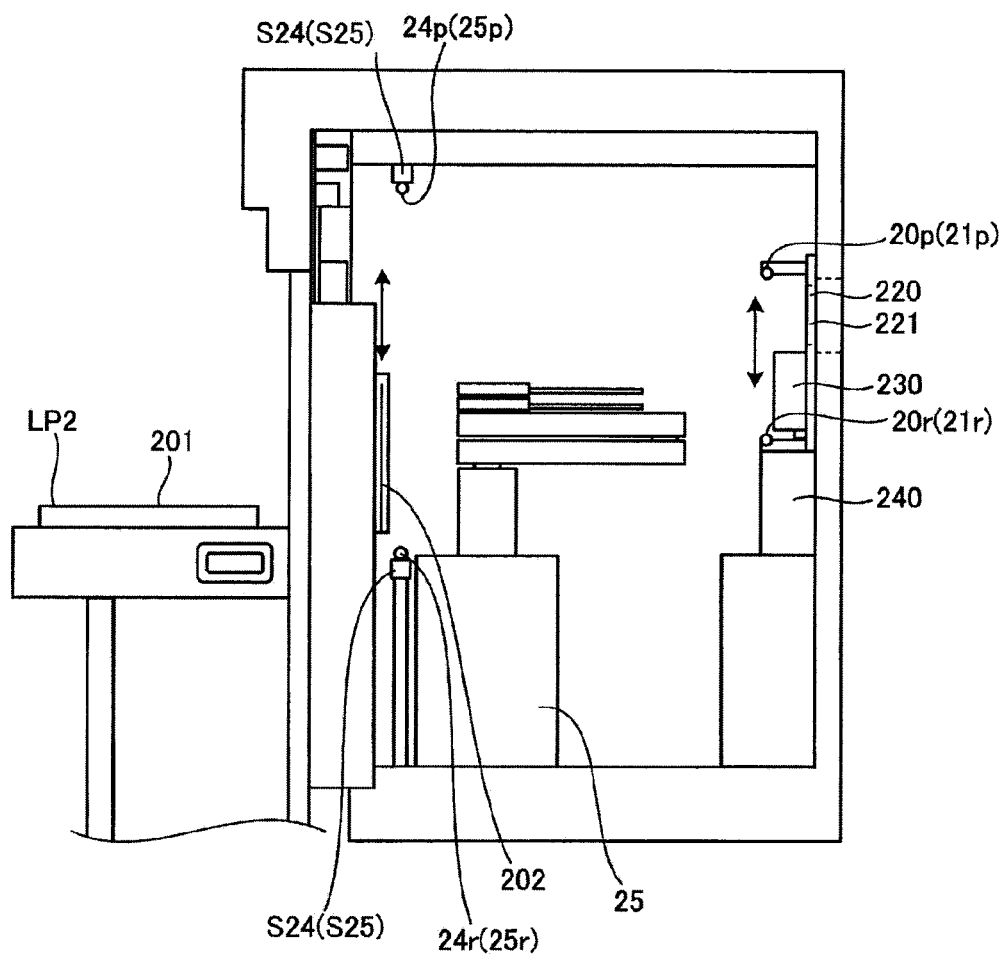
FIG. 17 explains the positions of third sensors in the system according to the embodiment.

FIG. 17 explains arrangement positions of the third sensors in the system according to the embodiment. FIG. 17 is a cross-sectional view of the atmospheric-pressure transfer chamber 20 of the system 1 shown in FIG. 1 as viewed from the right side to the left side.

In FIG. 17, the left side is a table 201 on which the FOUP that is provided in the load port LP2 is mounted. On the right side of the table 201, a door 202 is provided for communicating the atmospheric-pressure transfer chamber 20 and the inside of the FOUP. By moving the door 202 downward to move the lid of the FOUP, the inside of the FOUP communicates with the inside of the atmospheric-pressure transfer chamber 20. The gate valve GV connected to the load-lock module LLM1 is disposed on the side of the atmospheric-pressure transfer chamber 20 facing the load port LP2 (see FIGS. 18A to 18C). The gate valve GV is disposed between the load-lock module LLM and the atmospheric-pressure transfer chamber 20. The gate valve GV includes a plate 220, a movable lid 230, and a moving mechanism 240.

Figure 18A:
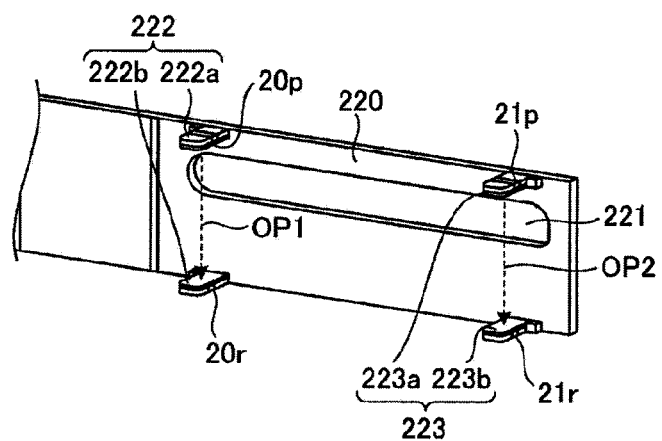
FIG. 18A is a schematic perspective view of a plate of a gate valve according to an embodiment.
Figure 18B:
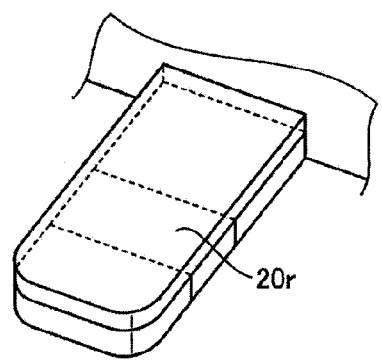
FIG. 18B is an enlarged schematic perspective view showing a part of the gate valve according to the embodiment.
Figure 18C:
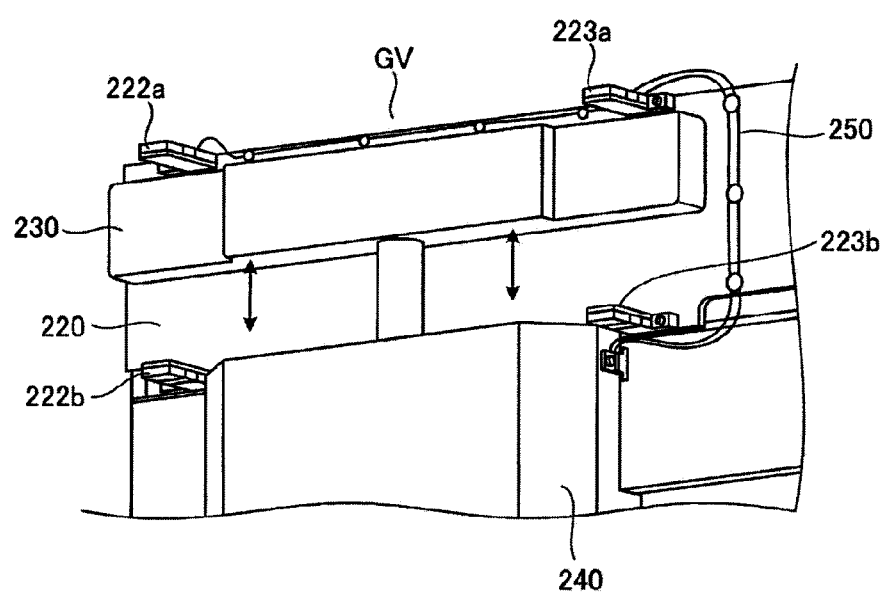
FIG. 18C is a schematic perspective view showing a closed state of the gate valve according to the embodiment.

FIG. 18A is a schematic perspective view of the plate 220 of the gate valve GV according to the embodiment. FIG. 18B is an enlarged schematic perspective view of a part of the gate valve GV according to the embodiment. FIG. 18C is a schematic perspective view showing a state in which an opening 221 of the gate valve GV according to the embodiment is closed.

The plate 220 is a plate-shaped member fixed in front of the load-lock module LLM1. When the plate 220 is placed in front of the load-lock module LLM1, the plate 220 shown in FIG. 18A has a substantially rectangular shape having an upper side, a right side, a lower side, and a left side when viewed from the atmospheric-pressure transfer chamber 20 side. However, the shape of the plate 220 is not particularly limited. The plate 220 is formed with the opening 221, a pair of upper and lower first protrusions 222 and a pair of upper and lower second protrusions 223.

The opening 221 defines a space through which the wafer W and the focus ring FR pass to be loaded and unloaded between the load-lock module LLM1 and the atmospheric-pressure transfer chamber 20. In the example of FIG. 18A, the opening 221 is formed above the center of the plate 220. The opening 221 has a substantially rectangular shape whose lateral width is larger than the outer diameter of the focus ring FR. The size and shape of the opening 221 are not particularly limited as long as the wafer W and the focus ring FR held on the pick 50 are loaded and unloaded in the horizontal direction.

The first protrusions 222 protrude from the plate 220 toward the atmospheric-pressure transfer chamber 20 side. The first protrusions 222 include an upper first protrusion 222a and a lower first protrusion 222b. The upper first protrusion 222a is a plate-like member that protrudes in the horizontal direction from the upper side of the plate 220. A light transmitting unit 20p of the third sensor S20 is disposed on the upper first protrusion 222a. The lower first protrusion 222b is a plate-like member that protrudes in the horizontal direction from the lower side of the plate 220. A light receiving unit 20r of the third sensor S20 is disposed on the lower first protrusion 222b. Alternatively, it is possible to dispose the light transmitting unit 20p on the lower first projection 222b and the light receiving unit 20r on the upper first projection 222a.

The light transmitting unit 20p of the upper first protrusion 222a emits light downward in the vertical direction. The light receiving unit 20r of the lower first protrusion 222b is disposed on an optical path OP1 of the light emitted from the light transmitting unit 20p. In the example of FIG. 18A, a line connecting the light transmitting unit 20p and the light receiving unit 20r extends along the vertical direction and passes in front of the space defined by the opening 221.

The shapes of the second protrusions 223 are the same as those of the first protrusions 222. The second protrusions 223 protrude from the plate 220 toward the atmospheric-pressure transfer chamber 20 side. The second protrusions 223 include an upper second protrusion 223a and a lower second protrusion 223b. The upper second protrusion 223a is a plate-like member that protrudes in the horizontal direction from the upper side of the plate 220. A light transmitting unit 21p of the third sensor S21 is disposed on the upper second protrusion 223a. The lower second protrusion 223b is a plate-like member that protrudes in the horizontal direction from the lower side of the plate 220. A light receiving unit 21r of the third sensor S21 is disposed on the lower second protrusion 223b.

The light transmitting unit 21p of the upper second protrusion 223a emits light downward in the vertical direction. The light receiving unit 21r of the lower second protrusion 223b is disposed on an optical path OP2 of the emitted light. In the example of FIG. 18A, a line connecting the light transmitting unit 21p and the light receiving unit 21r extends along the vertical direction and passes in front of the space defined by the opening 221.

The gate valve GV is provided with a connection unit 250 that connects each sensor to the controller 30 (see FIG. 18C). The connection unit 250 is, for example, a cable for transmitting a signal detected by the light receiving unit of each sensor to the controller 30.

The movable lid 230 is disposed on the plate 220 on the atmospheric-pressure transfer chamber 20 side (see FIG. 18C). The movable lid 230 is connected to the moving mechanism 240, and is moved up and down between the upper first and second protrusions 222a and 223a and the lower first and second protrusions 222b and 223b of the first protrusions 222 and the second protrusions 223 based on the driving power transmitted from the moving mechanism 240. The movable lid 230 covers the opening 221 when the movable lid 230 is located at the uppermost position within the movable range (see FIG. 18C) and closes the space between the load-lock module LLM1 and the atmospheric-pressure transfer chamber 20. When the movable lid 230 is located at the lowermost position within the movable range, the movable lid 230 opens the opening 221 and allows the load-lock module LLM1 and the atmospheric-pressure transfer chamber 20 to communicate with each other. A thickness of the movable lid 230 is set so as not to interfere with the optical paths OP1 and OP2 between the upper first and second protrusions 222a and 223a and the lower first and second protrusions 222b and 223b (see FIG. 17).

Referring back to FIG. 17, the third sensors S24 and S25 disposed on the load port LP2 side will be described. The third sensors S24 and S25 include light transmitting units 24p and 25p and light receiving units 24r and 25r, respectively. As shown in FIG. 17, the light transmitting units 24p and 25p of the third sensors S24 and S25 are provided on the ceiling side of the atmospheric-pressure transfer chamber 20. Further, the light receiving units 24r and 25r of the third sensors S24 and S25 are provided on the bottom side of the atmospheric-pressure transfer chamber 20. The wafer W and the focus ring FR transferred by the LM arm 25 pass across the optical path of light emitted from the light transmitting units 24p and 25p and received by the light receiving units 24r and 25r. The arrangement positions of the third sensors S24 and S25 are not particularly limited as long as the wafer W and the focus ring FR can pass across the optical path.

Figure 19A:
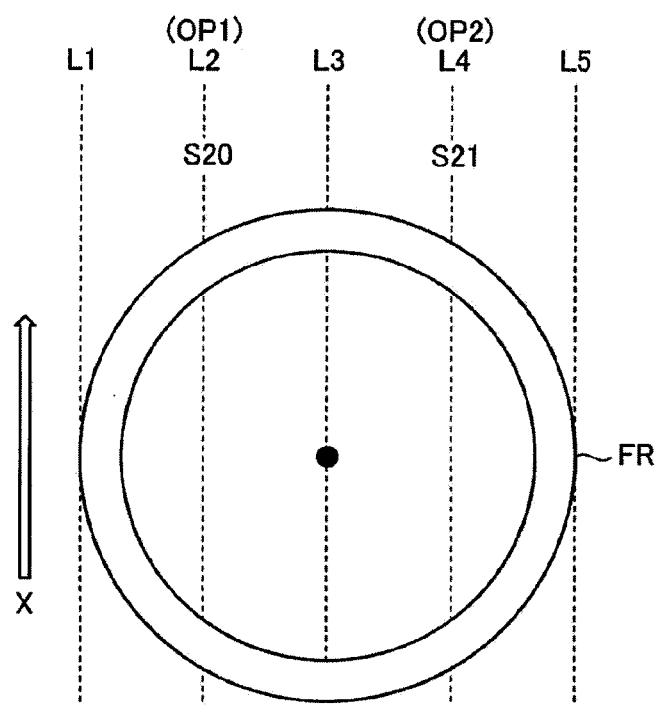
FIG. 19A explains a geometrical relation between a consumable that is being transferred and sensors in one embodiment.

Next, the misalignment detection using the third sensors will be described. FIG. 19A is a view for explaining a positional relationship between the consumable being transferred and the sensor in the embodiment. FIG. 19A shows a state in which the focus ring FR is transferred to the load-lock module LLM1 along the direction of the arrow X. In FIG. 19A, it is assumed that the load port LP2 is located at a lower position on the paper surface and the load-lock module LLM1 is located at an upper position on the paper surface. When the focus ring FR is transferred on the designed transport path, the center of the focus ring FR moves along a line L3. The third sensor S20 is disposed such that the optical path OP1 is located on a line L2 and extends perpendicular to the line L2. The third sensor S21 is disposed such that the optical path OP2 is located on a line L4 and extends perpendicular to the line L4. The third sensors S20 and S21 are disposed on lines perpendicular to the transferring direction of the focus ring FR. Further, each of the lines L2 and L4 is a line parallel to the line L3 and disposed at equal distances from the line L3.

Figure 19B:
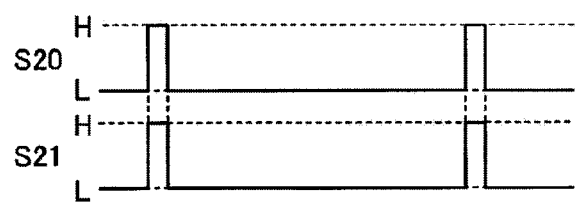
FIG. 19B shows example detection signals in the embodiment of FIG. 19A.

When the focus ring FR is correctly transferred without causing misalignment, a detection signal detected by the third sensor S20 and a detection signal detected by the third sensor S21 have the same waveform. FIG. 19B shows an example of detection signals in the example of FIG. 19A. When the focus ring FR passes between the light transmitting units 20p and 21p and the light receiving units 20r and 21r of the third sensors S20 and S21, the light emitted from the light transmitting units 20p and 21p is blocked by the focus ring FR. For example, the light receiving units 20r and 21r output high-level detection signals when no light is received thereto and low-level detection signals when the light is received thereto. In the case of example in FIG. 19A, each portion of the focus ring FR passes through the third sensors S20 and S21 simultaneously. Therefore, as shown in FIG. 19B, the detection signals output from the third sensors S20 and S21 are simultaneously high and simultaneously low.

Figure 20A:
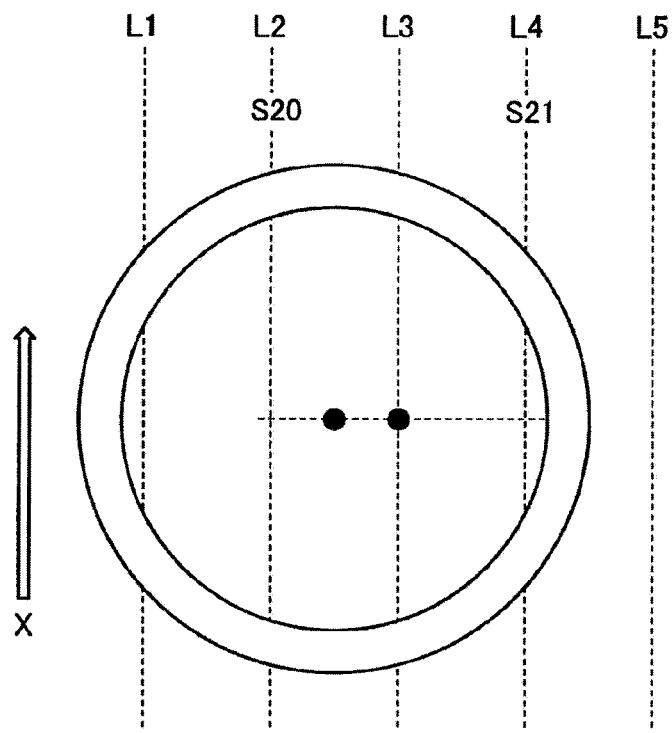
FIG. 20A explains misalignment of the consumable that is being transferred.
Figure 20B:
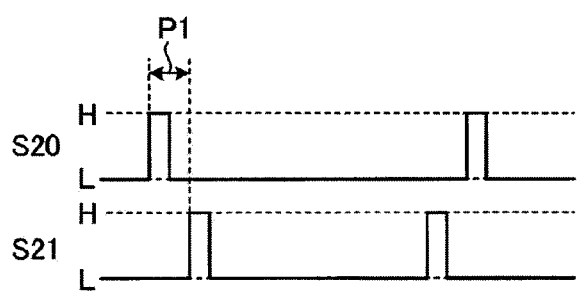
FIG. 20B shows example detection signals in the example of FIG. 20A.

In contrast, when the misalignment of the focus ring FR occurs, the detection signals output from the third sensors S20 and S21 have different waveforms. FIG. 20A is a view for explaining the misalignment of a consumable being transferred. In the example of FIG. 20A, the center of the focus ring FR is shifted (misaligned) to the line L2 side from the correct position (on the line L3). When the focus ring FR is transferred in the direction of the arrow X while maintaining its position as shown in FIG. 20A, the outer periphery of the focus ring FR blocks light emitted from the light transmitting unit 20p of the third sensor S20 earlier than light emitted from the light transmitting unit 21p of the third sensor S21. Thereafter, the light emitted from the light transmitting unit 21p of the third sensor S21 is blocked by the focus ring FR after the time period P1 (see FIG. 20B). When the focus ring FR further moved in the X direction, the light is blocked again by the third sensor S21 first, and then the light is blocked by the third sensor S20. Therefore, the detection signals obtained when the focus ring FR is transferred while the center of the focus ring FR is misaligned from the correct position may have, for example, the waveforms shown in FIG. 20B. The controller 30 detects the misalignment of the focus ring FR based on the difference in waveforms of the detection signals output from the third sensors S20 and S21. Consequently, the controller 30 can correct the misalignment of the focus ring FR.

Figure 21:
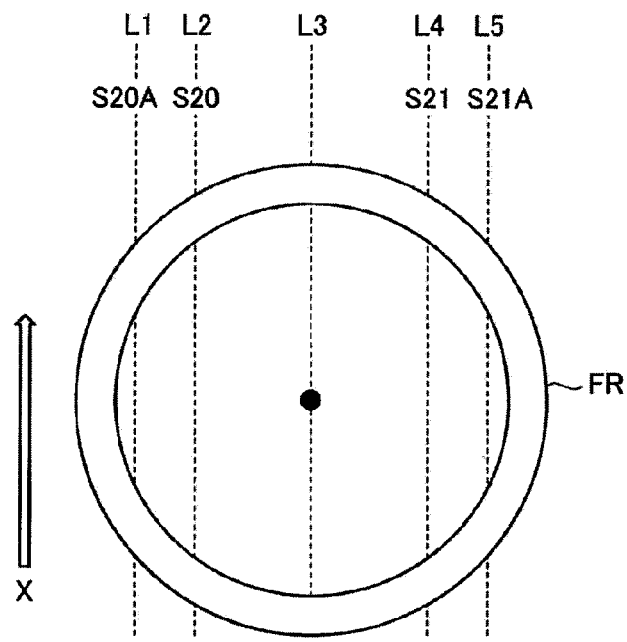
FIG. 21 shows a geometrical relation between the consumable and four sensors.

In the above examples, two sensors are provided such that the light transmitting unit and the light receiving unit of each sensor are disposed above and below the opening 221 of the gate valve GV that is disposed in front of the load-lock module LLM1. However, the present disclosure is not limited thereto, and three or more sensors may be provided. For example, FIG. 21 shows a positional relationship between consumable and sensors when four sensors are disposed. In the example of FIG. 21, sensors S20A and S21A are disposed in addition to the third sensors S20 and S21. Even when three or more sensors are disposed, each sensor includes the light transmitting unit and the light receiving unit disposed above and below the opening 221.

Further, in correcting the misalignment, either the outer diameter position or the inner diameter position of the focus ring FR detected by each sensor may be used or both of the outer diameter position and the inner diameter position may be used. However, in order to accurately correct the positional relationship between the wafer W and the focus ring FR, it is preferable to correct the misalignment using the inner diameter position.

Figure 22:
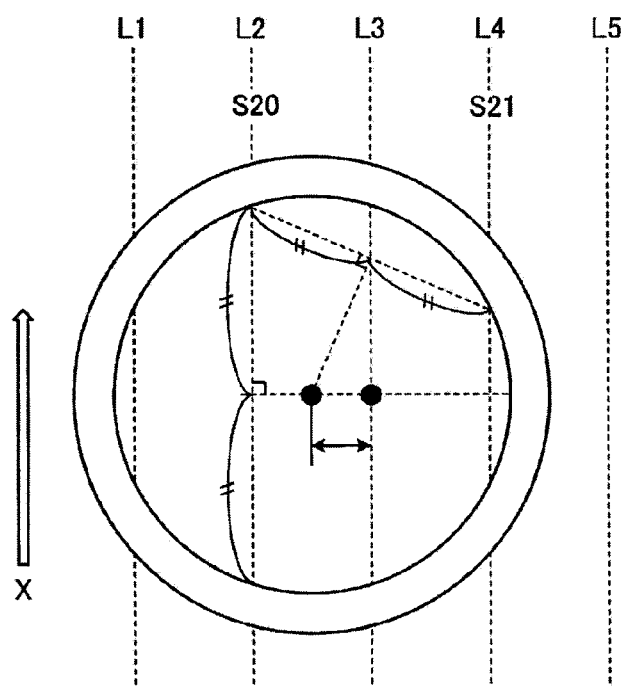
FIG. 22 explains a method for calculating misalignment of the consumable.

Further, the correction of the misalignment can be achieved by, for example, calculating the current center position of the focus ring FR as shown in FIG. 22 and moving the focus ring FR by the difference between the current center position and the correct center position. FIG. 22 is a view for explaining a method for calculating the misalignment of the consumable. As shown in FIG. 22, the orthogonal center line of a line connecting the inner diameter positions of the focus ring FR on the line L2 is drawn based on the detection signals. Further, the orthogonal center line of a line connecting one of the intersections between the line L2 and the inner diameter positions and one of the intersections between the line L4 and the inner diameter positions is drawn. The intersection of the two center lines is the current center of the focus ring FR. Based on the distance between the current center of the focus ring FR thus obtained and the line L3, the position of the focus ring FR is corrected.

When two sensors are disposed in front of the opening 221, the arrangement interval between the two sensors is wider than the width of the pick and shorter than the inner diameter of the focus ring FR. For example, when four sensors are disposed in front of the opening 221, the arrangement interval between the two sensors disposed on the outermost side is wider than the width of the pick and shorter than the inner diameter of the focus ring FR. Further, in each of the first sensors, the second sensors, and third sensors, the arrangement interval between the two outermost sensors is set to be shorter than the outer diameter of the wafer W in order to correct the misalignment of the wafer W as well as the misalignment of the focus ring FR.

Further, the first sensors, the second sensors, and third sensors are used to not only detect and correct the misalignments of the wafer W and the focus ring FR, but also detect whether or not the wafer W or the focus ring FR is held on the pick. For example, when the pick reaches the load-lock module LLM, the third sensor detects an object by moving the tip of the pick to the left and right to thereby determine the presence of the wafer W or the focus ring FR on the pick. Similarly, when the pick reaches the load port LP, the presence of the wafer W or the focus ring FR can be determined in the same manner.

Further, the third sensor disposed in front of the load port LP is disposed at a position that does not interfere with the opening and closing of the door 202 of the load port LP. Further, no structures or objects other than the wafer W and the focus ring FR are to be disposed on the optical path connecting the light transmitting unit and the light receiving unit of the third sensor. The same can be applied to the third sensor disposed in front of the load-lock module LLM.

(Modification)

In the present embodiment, an instruction input from the operator is a requirement for the installation execution and the removal completion of the FR FOUP. However, the system 1 may be configured so that the instruction input by the operator can be omitted.

Further, in the present embodiment, the type of FOUP (FR ROUP or wafer FOUP) that can be installed onto each load port LP is fixed, but it may be configured so that any of the FR FOUP and the wafer FOUP can be installed for all the load ports LP. In this case, the third sensor may be installed in front of all the load ports LP. The types of the mapping sensor MS and the first to third sensors are not particularly limited, but a transmissive photoelectric sensor or the like may be used.

In the present embodiment, the controller 30 includes the display unit 34. However, it may be configured so that a screen generated by the controller 30 is transmitted to a different device through the input/output interface 33 and displayed on the different device.

Advantageous Effect of Embodiment

The system according to the embodiment includes an atmospheric-pressure transfer chamber, at least one vacuum processing chamber, at least two load-lock modules, a vacuum transfer chamber, a plurality of load ports, a first transfer mechanism, a second transfer mechanism, and a controller. In the atmospheric-pressure transfer chamber, substrates and consumables are transferred under an atmospheric-pressure atmosphere. In the vacuum processing chamber, the substrates are processed under vacuum. The load-lock modules are disposed between the atmospheric-pressure transfer chamber and the vacuum processing chamber, and the substrates and the consumables are transferred between the atmospheric-pressure transfer chamber and the vacuum processing chamber therethrough. The vacuum transfer chamber is disposed between the vacuum processing chamber and the load-lock modules, and the substrates and the consumables are transferred therein under a reduced pressure atmosphere. The load ports are attached to the atmospheric-pressure transfer chamber and the substrates or the consumables are transferred between a plurality of containers each of which stores the substrates or the consumables and the atmospheric-pressure transfer chamber. The containers are detachably mounted on the load ports, respectively. The first transfer mechanism is configured to transfer the substrates and the consumables between the load-lock modules and the vacuum processing chamber through the vacuum transfer chamber. The second transfer mechanism is configured to transfer the substrates and the consumables between the containers and the load-lock modules through the atmospheric-pressure transfer chamber. The controller is configured to control the first transfer mechanism and the second transfer mechanism to concurrently transfer unused consumables from the containers to the vacuum processing chambers through the atmospheric-pressure transfer chamber and one of the load-lock modules and to transfer used consumables from the vacuum processing chambers through the vacuum transfer chamber and another one of the load-lock modules.

Such a configuration enables the system according to the embodiment to shorten the time required to replace the consumables in the vacuum processing chamber, thus to improve the operation rate of the system. If the wafers are transferred through a single load-lock module, the transfer operation is in the standby mode while the load-lock module is being exposed to the atmosphere or being evacuated. In contrast, the system according to the embodiment transfers consumables through two load-lock modules. The system according to the embodiment executes the replacement process when no wafer is disposed on the first transfer mechanism and the second transfer mechanism and in the load-lock modules. The two load-lock modules can thereby be occupied for the loading and unloading, respectively, and the time required to replace the consumables can be shortened.

In the system according to the embodiment, the containers includes a first container that accommodates the substrates and a second container that accommodates the consumables, and the load ports include a first load port on which the first container is mountable and a second load port on which the second container is mountable.

Such a configuration in the system according to the embodiment enables the substrate container and the consumable container to be attached to the atmospheric-pressure transfer chamber in the same manner and the consumables to be replaced.

In the system according to the embodiment, the controller controls the display unit to display the states of the containers mounted on the load ports.

Such a configuration in the system according to the embodiment allows the operator to easily check the states of the mounted containers.

In the system according to the embodiment, the controller controls the display unit to display the first load port and the second load port among the load ports in a distinguishable manner.

Such a configuration in the system according to the embodiment allows the operator to easily confirm the position of the second container that accommodates the consumables.

In the system according to the embodiment, the controller accepts the request for replacement of the consumable disposed in the vacuum processing chamber. If the controller determines that no substrate and consumable are being transferred in the vacuum transfer chamber, the load-lock modules, and the atmospheric-pressure transfer chamber, the controller controls the first transfer mechanism and the second transfer mechanism to replace the consumable.

Such a configuration in the system according to the embodiment allows the replacement of the consumable without hindering the treatment of the substrate. In addition, the system according to the embodiment can perform the replacement of the consumable without contamination or damage of the substrate.

In the system according to the embodiment, the controller also accepts the request for replacement if the second container is mounted on the second load port and does not accept the request for replacement if the second container is not mounted on the second load port.

Such a configuration in the system according to the embodiment can prevent acceptance of the request for replacement if a consumable to be used for the replacement is not prepared.

In the system according to the above embodiment, the controller accepts mounting of the second container to the second load port only in response to input of a predetermined instruction.

Such a configuration in the system according to the embodiment can prevent the second container that accommodates the consumable from being installed without the operator being aware of it.

The system according to the embodiment further includes sensors configured to detect the substrate disposed in the first container and the consumable disposed in the second container. The controller changes parameters of the sensors in response to the input of a predetermined instruction.

Such a configuration in the system can execute the detection with parameters in association with each of the substrate and the consumable.

In the system according to the embodiment, a holder configured to hold the substrate and the consumable is provided at a tip of an arm of the transfer mechanism (the first transport mechanism and the second transport mechanism) that transfers the substrate and the consumable. The holder includes a first face, a plurality of bumps, and a plurality of stops. The first face is brought into contact with a lower face of the substrate and a lower face of the consumable during the transfer of the substrate and the consumable. The bumps are disposed on the first face and hold the substrate. The stops to hold the consumable are disposed on the first face and are disposed outside the first circle on which the bumps are disposed. Each of the stops has an inwardly sloped face extending from the outer end of the corresponding stop disposed on a second circle having a diameter larger than an outer diameter of the consumable toward the center of the second circle.

Such a configuration enables the stops to reduce the contact area with the consumable and to prevent the consumable from sticking to or jumping over the stops. Since the stops are disposed outside the bumps, the ring-shaped consumable can be held by the stops without contact with the bumps.

In the holder, the height of each bump from the first face is higher than the height of the outer end of each stop from the first face. The bumps can thus hold the substrate without bringing the substrate into contact with the stops.

Such a configuration reduces adhesion of the substrate to the holder according to the embodiment.

In the holder, the inner edge of each of the stops may be disposed on a third circle located between an inner diameter and the outer diameter of the consumable. The inner edge of each of the stops may be disposed on a fourth circle having a diameter smaller than the inner diameter of the consumable.

The geometry of the stops can accordingly be determined depending on the shape of the transferred consumable.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A system of processing a substrate comprising:
an atmospheric-pressure transfer chamber;
a first vacuum processing chamber for processing the substrate, wherein a consumable is positioned in the first vacuum processing chamber during processing of the substrate;
wherein the consumable becomes a used consumable after processing, and when replacement is desired or needed, the used consumable is replaced with a replacement consumable;
a vacuum transfer chamber adjacent to the first vacuum processing chamber, the substrate and the consumable being configured to be transferred in the vacuum transfer chamber under a reduced pressure;
at least two load-lock structures disposed between the atmospheric-pressure transfer chamber and the vacuum transfer chamber, the load-lock structures each being configured to transfer the substrate or the consumable between the atmospheric-pressure transfer chamber and the vacuum transfer chamber;
a plurality of load ports attached to the atmospheric-pressure transfer chamber;
a plurality of detachable containers detachably mountable on the respective load ports;
a first transfer arm configured to transfer the substrate and the consumable, including the used consumable or the replacement consumable, between the load-lock structures and the first vacuum processing chamber through the vacuum transfer chamber;
a second transfer arm configured to transfer the substrate and the consumable, including the used consumable or the replacement consumable, between the containers and the load-lock structures through the atmospheric-pressure transfer chamber; and
a controller configured to:
control the first and second transfer arms to perform a first transfer sequence in order including: (1) getting the used consumable from the first vacuum processing chamber, with the first transfer arm, so that the used consumable is held by the first transfer arm and (2) after part (1) of the first transfer sequence, transferring the used consumable from the first vacuum processing chamber through the vacuum transfer chamber to one of the load-lock structures with the first transfer arm; and
control the first and second transfer arms to perform a second transfer sequence in order including: (1) getting the replacement consumable from one of the containers with the second transfer arm, so that the replacement consumable is held by the second transfer arm and (2) after part (1) of the second transfer sequence, transferring the replacement consumable from the one of the containers to another of the load-lock structures with the second transfer arm,
wherein the controller is further configured to control the first transfer sequence and the second transfer sequence such that part (1) of the first transfer sequence is concurrent and at least partially overlaps in time with part (1) of the second transfer sequence, wherein:
the controller is further configured to identify whether each container of the plurality of containers contains the consumable or the substrate;
the controller is further configured to determine whether replacement of the consumable is required; and
the controller is further configured to control the system to perform a replacement path securing process after determining replacement of the consumable is required and before performing the first transfer sequence and the second transfer sequence, the replacement path securing process including at least one of:
(a) in response to a determination that the substrate is present in a second vacuum processing chamber, making the substrate wait in the second vacuum processing chamber until after the first transfer sequence and the second transfer sequence are completed;
(b) in response to a determination that the substrate is present in the vacuum transfer chamber, the load-lock structures, or the atmospheric-pressure transfer chamber, and a processing for the substrate in the first or second vacuum processing chamber has been completed and a subsequent processing for the substrate in a third vacuum processing chamber is not completed, transferring the substrate to the third vacuum processing chamber for the subsequent processing; or
(c) in response to a determination that the substrate is present in the vacuum transfer chamber, the load-lock structures, or the atmospheric-pressure transfer chamber, and the processing for the substrate has been completed, transferring the substrate to one of the plurality of detachable containers.

2. The system of claim 1, wherein the plurality of detachable containers include a first container that accommodates plural substrates and a second container that accommodates plural consumables, and the plurality of load ports include a first load port on which the first container is mountable and a second load port on which the second container is mountable, and wherein said one of the containers of part (2) of the second transfer sequence is said second container.

3. The system of claim 2, wherein the controller includes a display and the controller is configured to control the display to display states of the containers mounted on the plurality of load ports.

4. The system of claim 2, wherein the controller includes a display and the controller is configured to control the display to display the first load port and the second load port such that the first and second load ports are distinguishable from each other.

5. The system of claim 2, wherein
the controller is configured to accept mounting of the second container to the second load port only in response to input of a predetermined instruction.

6. The system of claim 5, further comprising:
sensors each configured to detect the substrate disposed in the first container and the consumable disposed in the second container,
wherein the controller is configured to change parameters of the sensors in response to the input of the predetermined instruction.

7. The system of claim 1, wherein
the system comprises additional vacuum processing chambers.

8. The system of claim 7, wherein the plurality of detachable containers include one or more containers configured to hold focus rings as the consumable, and the one or more containers are configured to hold at least one used and one replacement focus ring for each of the first, second, third, and additional vacuum processing chambers.

9. The system of claim 1, wherein at least one of the first transfer arm or the second transfer arm includes an arm having a holder positioned at a tip of the arm, the holder comprising:
a first face to be in contact with a lower face of the substrate or a lower face of the consumable during the transfer of the substrate or the consumable;
bumps having a first height, the bumps being disposed for holding the substrate on a first circle depicted on the first face; and
wedged stops for holding the consumable, each wedged stop having an inner edge and an outer end having a second height, the outer ends of the stops being disposed on a second concentric circle depicted on the first face, the second circle being larger than an outer diameter of the consumable,
wherein each of the stops has an inwardly sloped surface.

10. The system of claim 1,
wherein the controller is further configured to control the first and second transfer arms such that part (2) of the first transfer sequence is concurrent with and at least partially overlaps in time with part (2) of the second transfer sequence.

11. The system of claim 10, wherein the controller is further configured to:
control the first transfer sequence to further include, in sequence after parts (1) and (2), (3) picking up the used consumable from the one load-lock structure with the second transfer arm, and (4) transferring the used consumable through the atmospheric-pressure transfer chamber and into one of the containers with the second transfer arm;
control the second transfer sequence to further include, in sequence after parts (1) and (2), (3) picking up the replacement consumable from the another load-lock structure with the first transfer arm, and (4) transferring the replacement consumable from the another load-lock structure to the first vacuum processing chamber with the first transfer arm,
wherein the controller is further configured to control the first and second transfer sequences so that part (3) of the first transfer sequence is at least partially concurrent with and overlaps in time with part (3) of the second transfer sequence, and part (4) of the first transfer sequence is at least partially concurrent with and overlaps in time with part (4) of the second transfer sequence.

12. The system of claim 11, wherein the controller is further configured to not carry out the first transfer sequence or the second transfer sequence if a substrate is being transferring in the system.

13. The system of claim 11, wherein the controller is configured to control the first and second transfer sequences so that replacement consumables are removed from one of the containers and used consumables are transferred into the same one of the containers.

14. The system of claim 1, wherein the controller is configured to determine, prior to controlling the first transfer sequence and the second transfer sequence, whether a substrate is present along a transfer path extending from one of the containers to one of the first vacuum processing chamber, the second vacuum processing chamber, and the third vacuum processing chamber, and the controller is configured to not carry out the first sequence or the second sequence if a substrate is present along the transfer path.

\* \* \* \* \*